(12) United States Patent
Mleczko

(10) Patent No.: US 10,142,532 B2
(45) Date of Patent: Nov. 27, 2018

(54) CAMERA FOR VEHICLE VISION SYSTEM

(71) Applicant: MAGNA ELECTRONICS INC., Auburn Hills, MI (US)

(72) Inventor: Jamie A. Mleczko, Washington, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 53 days.

(21) Appl. No.: 15/478,274

(22) Filed: Apr. 4, 2017

(65) Prior Publication Data

US 2017/0295306 A1 Oct. 12, 2017

Related U.S. Application Data

(60) Provisional application No. 62/319,953, filed on Apr. 8, 2016.

(51) Int. Cl.
*H04N 5/225* (2006.01)
*H04N 7/18* (2006.01)
(Continued)

(52) U.S. Cl.
CPC ....... *H04N 5/2257* (2013.01); *B29C 45/1615* (2013.01); *B29C 45/77* (2013.01); *H04N 5/2252* (2013.01); *H04N 5/2254* (2013.01); *H04N 7/183* (2013.01); *H05K 1/181* (2013.01); *H05K 5/0034* (2013.01); *B29C 2945/76498* (2013.01);
(Continued)

(58) Field of Classification Search
CPC ........... B29C 2945/76498; B29C 2945/76859; B29C 45/1615; B29C 45/77; B29K 2069/00; B29K 2077/00; B29L 2031/3481; H04N 5/2252; H04N 5/2254; H04N 5/2257; H04N 7/183; H05K 1/181; H05K 2201/10121
See application file for complete search history.

(56) References Cited

U.S. PATENT DOCUMENTS 4,786,966 A   11/1988   Hanson et al.
5,204,615 A   4/1993   Richards
(Continued)

FOREIGN PATENT DOCUMENTS

JP   08084277   3/1996

*Primary Examiner* — Amy Hsu
(74) *Attorney, Agent, or Firm* — Honigman Miller Schwartz and Cohn, LLP

(57) ABSTRACT

A vehicular camera module includes a circuit element and a lens mounting element disposed at the circuit element and optically aligned with an imager of the circuit element. An inner lower pressure polymer molding is formed at least partially over and around the circuit element and the lens mounting element so that the inner molding and the lens mounting element substantially encase the circuit element. A connector element is disposed at an aperture of the inner molding so as to be in electrical contact with the electrical connecting elements of the circuit element. An outer higher pressure injection molded shell is molded over and around the inner molding and part of the lens mounting element so as to encase the inner molding. The outer shell includes a connector portion that generally surrounds the connector element, with the connector element being accessible at the connector portion of the outer shell.

20 Claims, 23 Drawing Sheets

(51) Int. Cl.
*H05K 1/18* (2006.01)
*H05K 5/00* (2006.01)
*B29C 45/16* (2006.01)
*B29C 45/77* (2006.01)
*B29L 31/34* (2006.01)
*B29K 77/00* (2006.01)
*B29K 69/00* (2006.01)

(52) U.S. Cl.
CPC ............ *B29C 2945/76859* (2013.01); *B29K 2069/00* (2013.01); *B29K 2077/00* (2013.01); *B29L 2031/3481* (2013.01); *H05K 2201/10121* (2013.01); *Y02P 70/611* (2015.11)

(56) References Cited

U.S. PATENT DOCUMENTS

| | | |
|---|---|---|
| 5,525,264 A | 6/1996 | Cronin et al. |
| 5,550,677 A | 8/1996 | Schofield et al. |
| 5,559,556 A | 9/1996 | Kagebeck |
| 5,657,539 A | 8/1997 | Orikasa et al. |
| 5,670,935 A | 9/1997 | Schofield et al. |
| 5,821,532 A | 10/1998 | Beaman et al. |
| 5,854,708 A | 12/1998 | Komatsu et al. |
| 5,872,332 A | 2/1999 | Verma |
| 5,920,061 A | 7/1999 | Feng |
| 5,949,331 A | 9/1999 | Schofield et al. |
| 5,978,017 A | 11/1999 | Tino |
| 6,002,544 A | 12/1999 | Yatsu |
| 6,013,372 A | 1/2000 | Hayakawa et al. |
| 6,071,606 A | 6/2000 | Yamazaki et al. |
| 6,072,814 A | 6/2000 | Ryan et al. |
| 6,117,193 A | 9/2000 | Glenn |
| 6,151,065 A | 11/2000 | Steed |
| 6,178,034 B1 | 1/2001 | Allemand et al. |
| 6,193,378 B1 | 2/2001 | Tonar et al. |
| 6,222,447 B1 | 4/2001 | Schofield et al. |
| 6,259,475 B1 | 7/2001 | Ramachandran et al. |
| 6,292,311 B1 | 9/2001 | Bohn et al. |
| 6,481,003 B1 | 11/2002 | Maeda |
| 6,483,101 B1 | 11/2002 | Webster |
| 6,535,242 B1 | 3/2003 | Strumolo et al. |
| 6,559,439 B1 | 5/2003 | Tsuchida et al. |
| 6,590,658 B2 | 7/2003 | Case et al. |
| 6,603,612 B2 | 8/2003 | Nakano |
| 6,651,187 B2 | 11/2003 | Lacey, III |
| 6,654,187 B2 | 11/2003 | Ning |
| 6,805,767 B2 | 10/2004 | Shinomiya |
| 6,897,432 B2 | 5/2005 | Schmidtke et al. |
| 7,015,944 B2 | 3/2006 | Holz et al. |
| 7,031,075 B2 | 4/2006 | Tsuji |
| 7,095,123 B2 | 8/2006 | Prior |
| 7,095,572 B2 | 8/2006 | Lee et al. |
| 7,215,479 B1 | 5/2007 | Bakin |
| 7,268,957 B2 | 9/2007 | Frenzel et al. |
| 7,289,037 B2 | 10/2007 | Uken et al. |
| 7,391,458 B2 | 6/2008 | Sakamoto |
| 7,419,315 B2 | 9/2008 | Hirata et al. |
| 7,423,665 B2 | 9/2008 | Ray et al. |
| 7,453,509 B2 | 11/2008 | Losehand et al. |
| 7,480,149 B2 | 1/2009 | DeWard et al. |
| 7,536,316 B2 | 5/2009 | Ozer et al. |
| 7,599,134 B2 | 10/2009 | Bechtel et al. |
| 7,665,915 B2 | 2/2010 | Lee |
| 7,697,056 B2 | 4/2010 | Huang |
| 7,768,574 B2 | 8/2010 | Humpston |
| 7,777,611 B2* | 8/2010 | Desai ............... B60Q 1/2665 340/425.5 |
| 7,965,336 B2 | 6/2011 | Bingle et al. |
| 8,120,652 B2 | 2/2012 | Bechtel et al. |
| 8,256,821 B2 | 9/2012 | Lawlor et al. |
| 8,318,512 B2 | 11/2012 | Shah et al. |
| 8,367,170 B2* | 2/2013 | Elia ............... F16J 1/01 428/34.1 |
| 8,482,664 B2 | 7/2013 | Byrne et al. |
| 8,542,451 B2 | 9/2013 | Lu et al. |
| 8,994,878 B2 | 3/2015 | Byrne et al. |
| 9,077,098 B2 | 7/2015 | Latunski |
| 9,233,641 B2 | 1/2016 | Sesti et al. |
| 9,277,104 B2 | 3/2016 | Sesti et al. |
| 9,338,334 B2 | 5/2016 | Lu et al. |
| 9,365,160 B2 | 6/2016 | Byrne et al. |
| 9,487,159 B2 | 11/2016 | Achenbach |
| 9,596,387 B2 | 3/2017 | Achenbach et al. |
| 9,992,392 B2 | 6/2018 | Byrne et al. |
| 2001/0040737 A1 | 11/2001 | Nakano |
| 2002/0167605 A1 | 11/2002 | Akimoto et al. |
| 2002/0175832 A1 | 11/2002 | Mizusawa |
| 2003/0090569 A1 | 5/2003 | Poechmueller |
| 2003/0137595 A1 | 7/2003 | Takachi |
| 2004/0095502 A1 | 5/2004 | Losehand et al. |
| 2005/0104995 A1 | 5/2005 | Spryshak et al. |
| 2005/0128289 A1 | 6/2005 | Ray et al. |
| 2005/0141106 A1 | 6/2005 | Lee et al. |
| 2005/0190283 A1 | 9/2005 | Ish-Shalom et al. |
| 2005/0274883 A1 | 12/2005 | Nagano |
| 2006/0049533 A1 | 3/2006 | Kamoshita |
| 2006/0050018 A1 | 3/2006 | Hutzel et al. |
| 2006/0054802 A1 | 3/2006 | Johnston |
| 2006/0056077 A1 | 3/2006 | Johnston |
| 2006/0061008 A1* | 3/2006 | Karner ............... B29C 45/0017 264/250 |
| 2006/0065436 A1 | 3/2006 | Gaily et al. |
| 2006/0077575 A1 | 4/2006 | Nakai et al. |
| 2006/0103727 A1 | 5/2006 | Tseng |
| 2006/0110599 A1* | 5/2006 | Honma ............... B32B 5/10 428/413 |
| 2006/0125919 A1 | 6/2006 | Camilleri et al. |
| 2006/0171704 A1 | 8/2006 | Bingle et al. |
| 2006/0184297 A1 | 8/2006 | Higgins-Luthman |
| 2007/0040034 A1 | 2/2007 | Hennick |
| 2007/0096020 A1 | 5/2007 | Mitsugi et al. |
| 2007/0173619 A1* | 7/2007 | Yu ............... C08L 69/00 525/466 |
| 2007/0279518 A1 | 12/2007 | Abel et al. |
| 2008/0024883 A1 | 1/2008 | Iwasaki |
| 2008/0043105 A1 | 2/2008 | Kallhammer et al. |
| 2008/0122965 A1 | 5/2008 | Fang |
| 2009/0010494 A1 | 1/2009 | Bechtel et al. |
| 2009/0012203 A1 | 1/2009 | Nakanishi et al. |
| 2009/0244361 A1* | 10/2009 | Gebauer ............... H04N 5/2253 348/373 |
| 2009/0295181 A1 | 12/2009 | Lawlor et al. |
| 2010/0015713 A1 | 1/2010 | Deeter et al. |
| 2010/0097519 A1 | 4/2010 | Byrne et al. |
| 2010/0103308 A1 | 4/2010 | Butterfield et al. |
| 2010/0279439 A1 | 11/2010 | Shah et al. |
| 2011/0025850 A1 | 2/2011 | Maekawa et al. |
| 2011/0107835 A1* | 5/2011 | Campbell ......... B29C 45/14655 73/488 |
| 2011/0298968 A1 | 12/2011 | Tseng et al. |
| 2012/0081550 A1 | 4/2012 | Sewell |
| 2012/0265416 A1 | 10/2012 | Lu |
| 2013/0242099 A1 | 9/2013 | Sauer et al. |
| 2014/0000804 A1 | 1/2014 | Looi et al. |
| 2014/0022657 A1 | 1/2014 | Lu et al. |
| 2014/0313337 A1 | 10/2014 | Devota et al. |
| 2014/0373345 A1 | 12/2014 | Steigerwald |
| 2015/0029337 A1* | 1/2015 | Uchiyama ............ H04N 5/2252 348/148 |
| 2015/0124098 A1 | 5/2015 | Winden et al. |
| 2015/0222795 A1* | 8/2015 | Sauer ................... H04N 5/2257 348/148 |
| 2015/0266430 A1 | 9/2015 | Mleczko et al. |
| 2015/0327398 A1 | 11/2015 | Achenbach et al. |
| 2015/0365569 A1 | 12/2015 | Mai et al. |
| 2016/0037028 A1 | 2/2016 | Biemer |
| 2016/0243987 A1 | 8/2016 | Kendall |
| 2016/0255257 A1 | 9/2016 | Lu et al. |
| 2016/0268716 A1 | 9/2016 | Conger et al. |
| 2017/0048463 A1 | 2/2017 | Mleczko |
| 2017/0129419 A1 | 5/2017 | Conger et al. |
| 2017/0133811 A1 | 5/2017 | Conger et al. |
| 2017/0201661 A1 | 7/2017 | Conger |

(56) References Cited

U.S. PATENT DOCUMENTS

| | | |
|---|---|---|
| 2017/0295306 A1 | 10/2017 | Mleczko |
| 2018/0072239 A1 | 3/2018 | Wienecke et al. |
| 2018/0098033 A1 | 4/2018 | Mleczko et al. |

\* cited by examiner

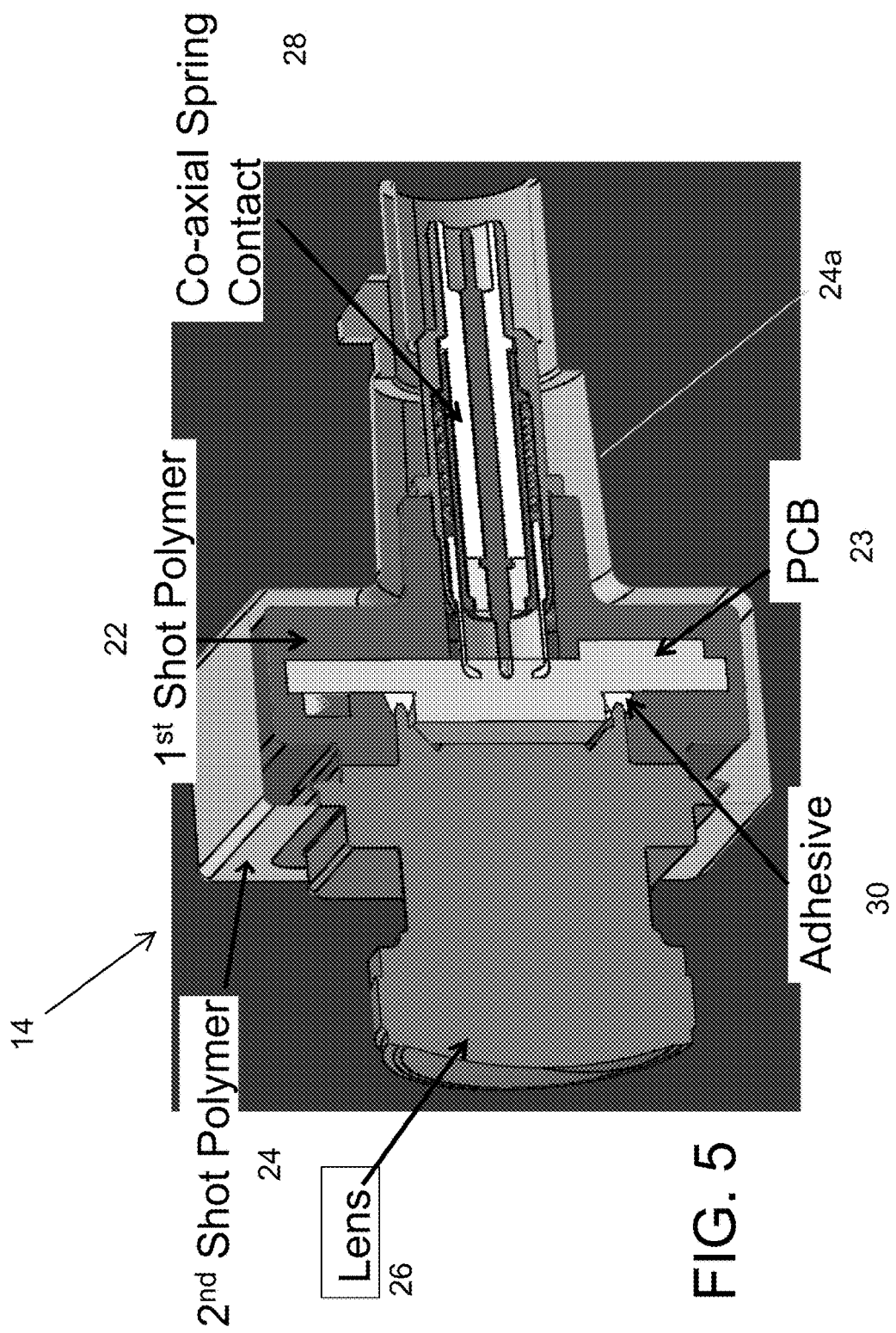

Current:
4 glue corners = 64 mm²

1.2mm Keepout around imager
= 49 mm²

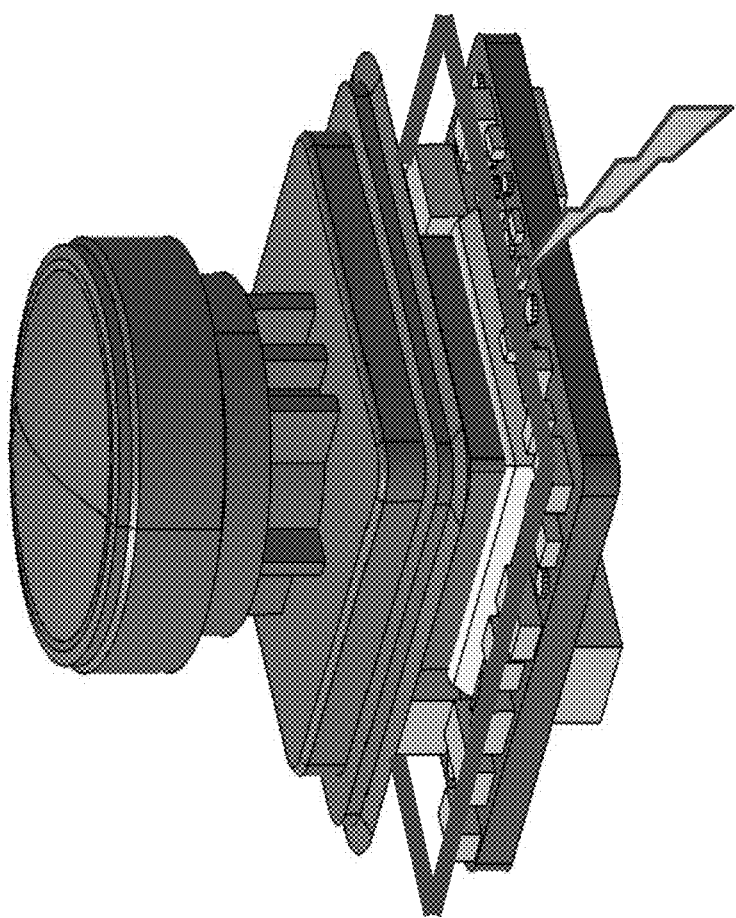
FIG. 12 Ring UV Light to cure glue and avoid shadows created by components (5sec)

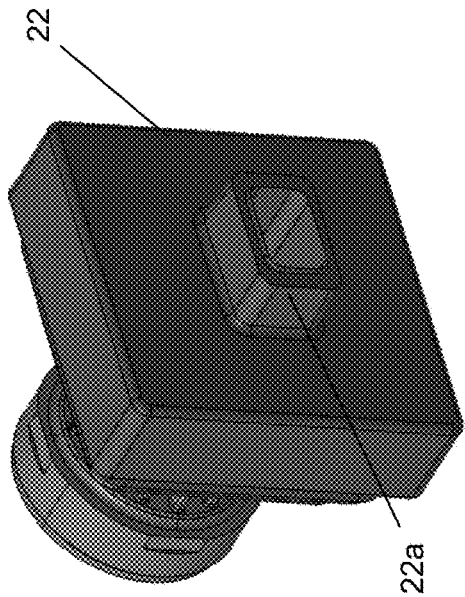
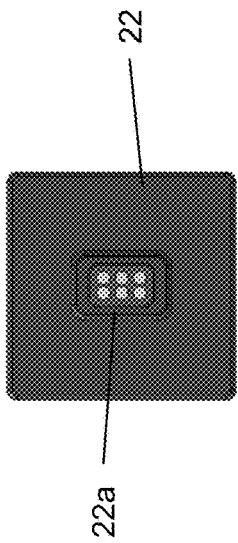
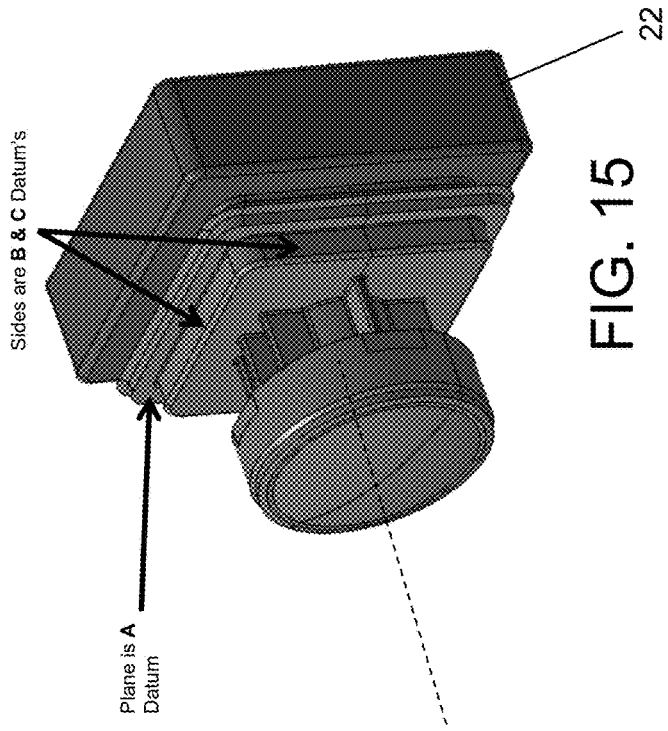
FIG. 16
FIG. 17
FIG. 15

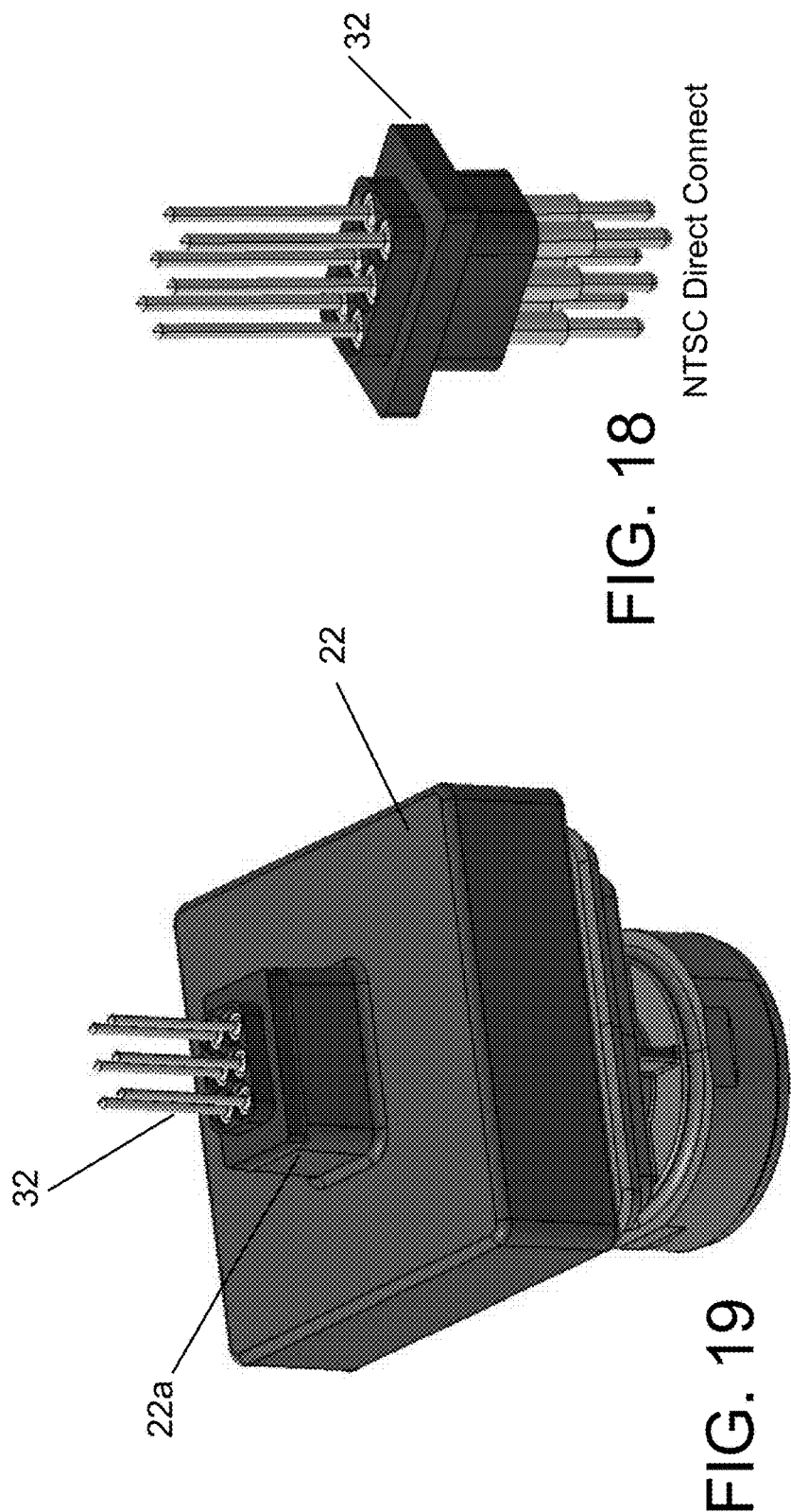

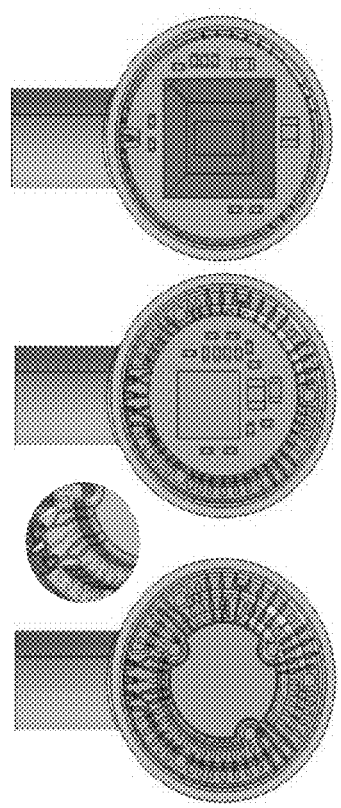
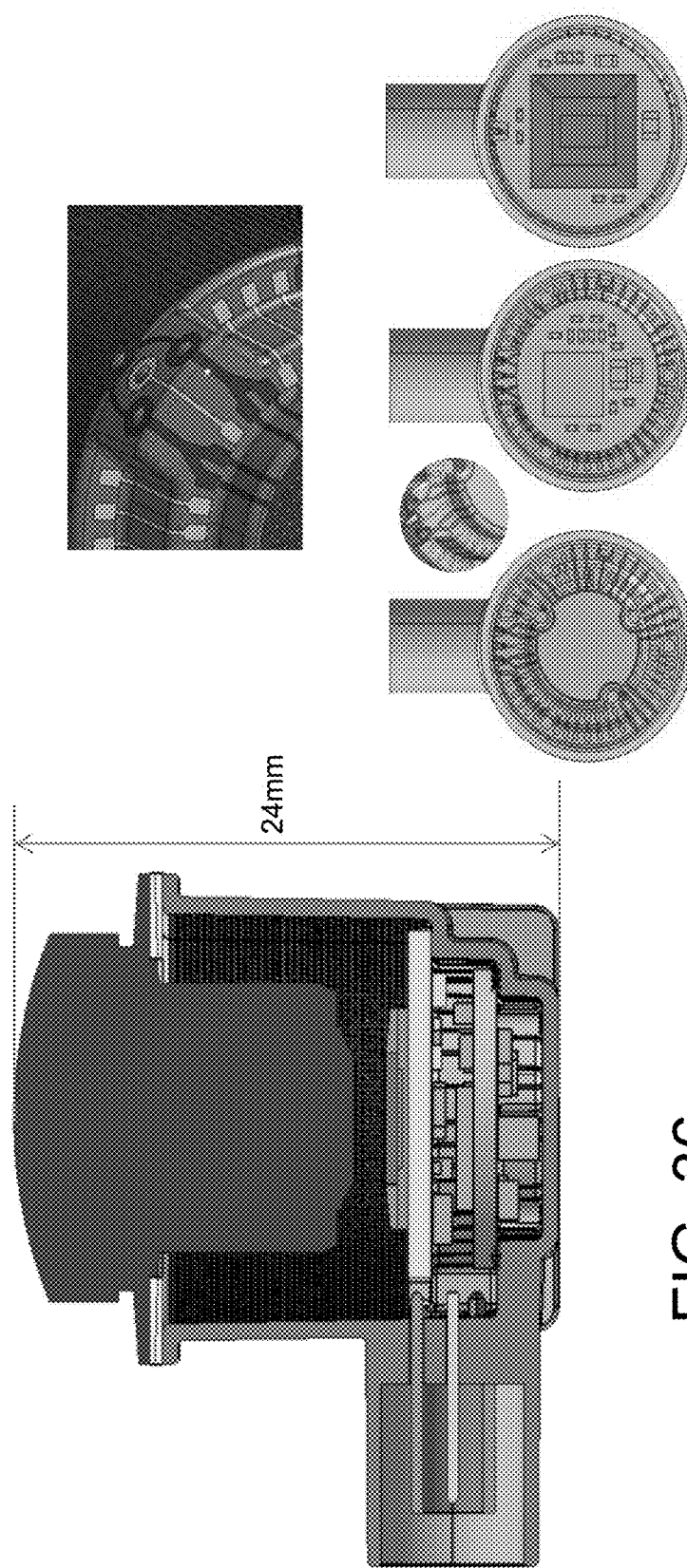
FIG. 37
FIG. 36

CAMERA FOR VEHICLE VISION SYSTEM

CROSS REFERENCE TO RELATED APPLICATION

The present application claims the filing benefits of U.S. provisional application Ser. No. 62/319,953, filed Apr. 8, 2016, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. Various cameras have been proposed for such imaging systems, including cameras of the types described in U.S. Pat. No. 7,965,336 and U.S. Publication No. US-2009-0244361, which are hereby incorporated herein by reference in their entireties.

SUMMARY OF THE INVENTION

The present invention provides a vision system or imaging system for a vehicle that utilizes one or more cameras (preferably one or more CMOS cameras) to capture image data representative of images exterior of the vehicle. The camera comprises an imager and a circuit board (or circuit boards) and a lens. The printed circuit board (PCB) is overmolded via a low pressure molding process to form an overmolded circuit board that is disposed at the lens and adjusted relative to the lens to focus and/or optically align the lens at the imager. The lens and overmolded circuit board construction is at least partially overmolded via a higher pressure molding process to form an outer shell for the camera, with the outer shell formed with a connector portion that provides the selected or desired shape or form for electrical connection to a connector end of a wire harness of the vehicle equipped with the camera. A particular type of connector element (such as a coaxial connector element or multi-pin connector element or the like) may be disposed at the connecting terminals of the overmolded circuit board prior to the overmolding process that forms the outer shell, whereby the connector portion is molded at and partially around the connector element to provide the selected or desired connector for the particular camera application.

The present invention thus provides a two shot overmolding process, and may allow for various electrical connecting elements to be used, with a simplistic PCB stacking structure to minimize configurations, and with a housing (either with or without electrical shielding). Optionally, the camera may have an adjustable focus, whereby the imager is adjustably positioned relative to the lens or lens assembly (and camera housing) to adjust the focus or focal length of the camera.

These and other objects, advantages, purposes and features of the present invention will become apparent upon review of the following specification in conjunction with the drawings.

BRIEF DESCRIPTION OF THE DRAWINGS

FIGS. 4 and 5 are sectional views of the camera module of FIG. 3;

FIG. 12 is a perspective view of the printed circuit board and lens holder assembly;

FIGS. 15 and 16 are perspective views of the printed circuit board and lens holder assembly, as overmolded via a first molding process in accordance with the present invention;

FIG. 17 is an end view showing of the overmolded printed circuit board and lens holder assembly, showing the electrical connecting elements at the circuit board and surrounded by an opening in the inner molding;

FIG. 18 is a perspective view of an NTSC connector elements configured to electrically connect to the connecting elements at the circuit board so as to provide a multi-pin connector at the connector portion of the camera module;

FIG. 19 is a perspective view of the overmolded printed circuit board and lens holder assembly, with the NTSC connecting elements disposed at the opening in the inner molding so as to electrically connect at the connecting elements at the circuit board;

FIG. 36 is a sectional view of another camera module of the present invention, having a circular printed circuit board; and FIG. 37 shows views showing the circular printed circuit board and connections for the camera module of FIG. 36.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
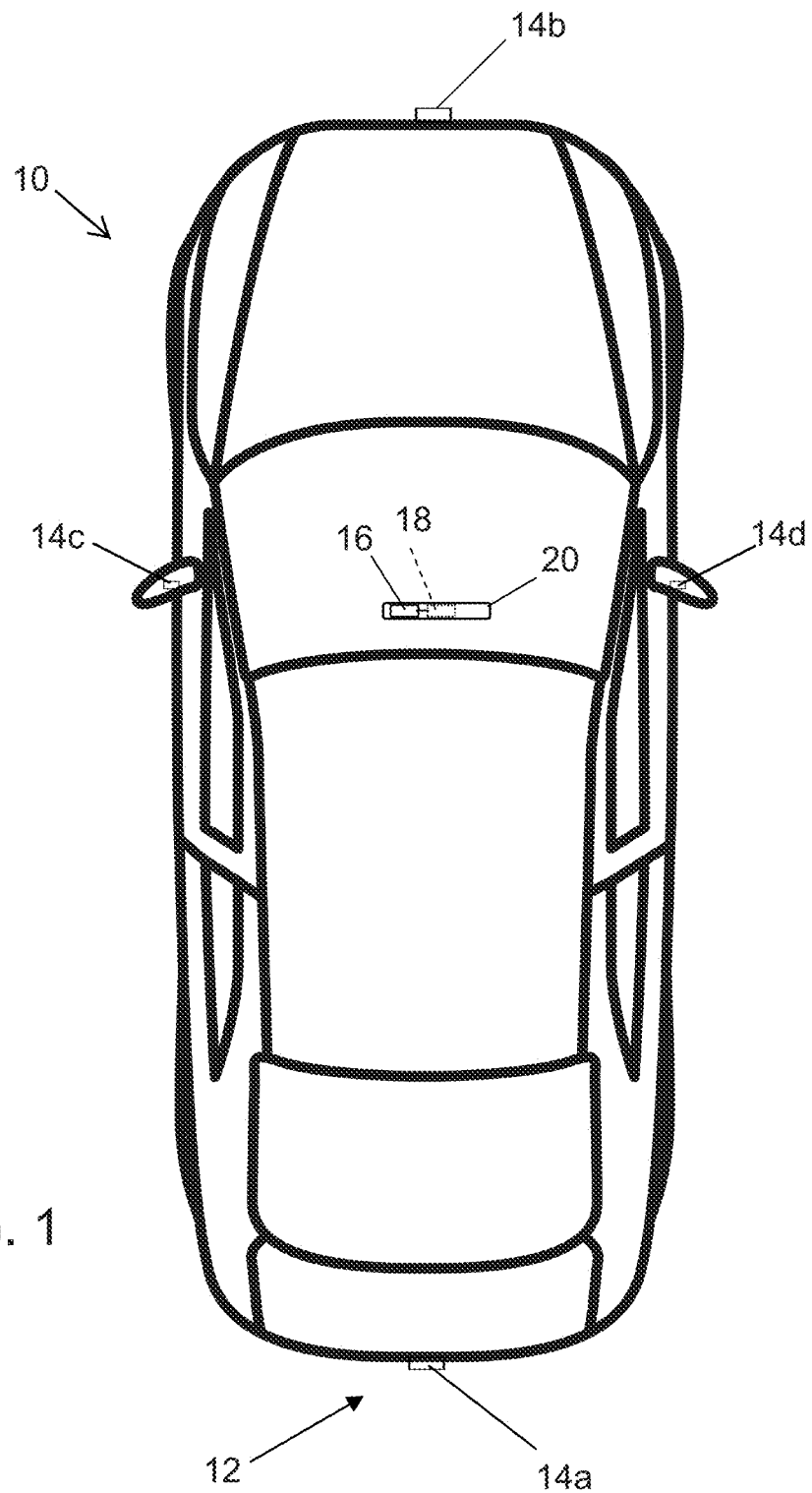
FIG. 1 is a plan view of a vehicle with a vision system that incorporates cameras in accordance with the present invention.

Referring now to the drawings and the illustrative embodiments depicted therein, a vehicle 10 includes an imaging system or vision system 12 that includes at least one exterior facing imaging sensor or camera, such as a rearward facing imaging sensor or camera 14a (and the system may optionally include multiple exterior facing imaging sensors or cameras, such as a forwardly facing camera 14b at the front (or at the windshield) of the vehicle, and a sidewardly/rearwardly facing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) or processor 18 that is operable to process image data captured by the camera or cameras and may detect objects or the like and/or provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

Figure 2:
FIG. 2 is an exploded schematic showing basic camera components.

As shown in FIG. 2, a camera module comprises a lens or light gathering system (which may be disposed in a lens barrel or lens holder), an imager or device that converts light to electrical signals for data interpolation (such as disposed on a printed circuit board with associated circuitry), and an electrical connector for electrically connecting the circuitry and imager to a vehicle connector when the camera is disposed at the vehicle. Preferably, the vehicle camera should be compact in size with reduced components, and with reduced cost and short or reduced manufacturing cycle times. The vehicle camera should also provide scalable architecture and customer independent technology (such as direct connect, pigtail connector, brackets and/or the like) so that the camera is readily adaptable for different applications. The present invention provides a camera module that meets these criteria by providing a lower pressure molding over the circuit board and circuitry, and then a higher pressure injection molding over the low pressure molding and over part of the lens holder and over part of the connecting elements, as discussed below.

Figure 3:
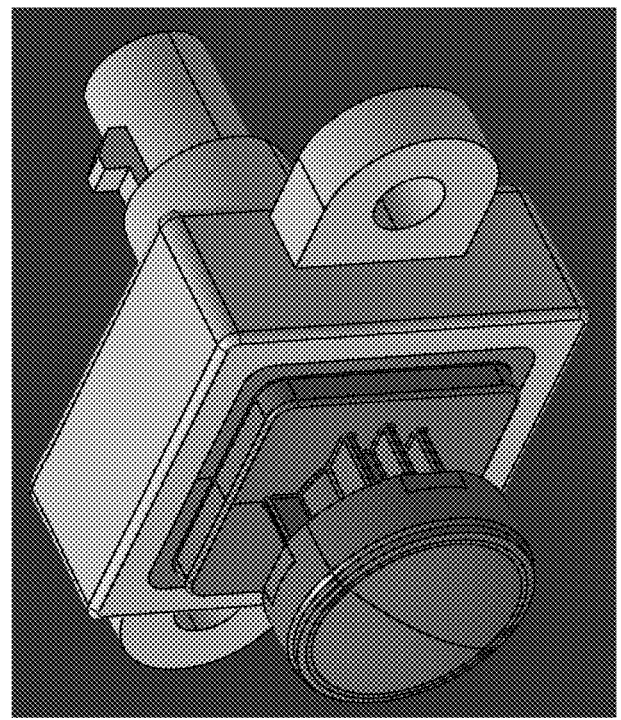
FIG. 3 is a perspective view of a camera module of the present invention, shown with a digital signal connector portion.
Figure 4:
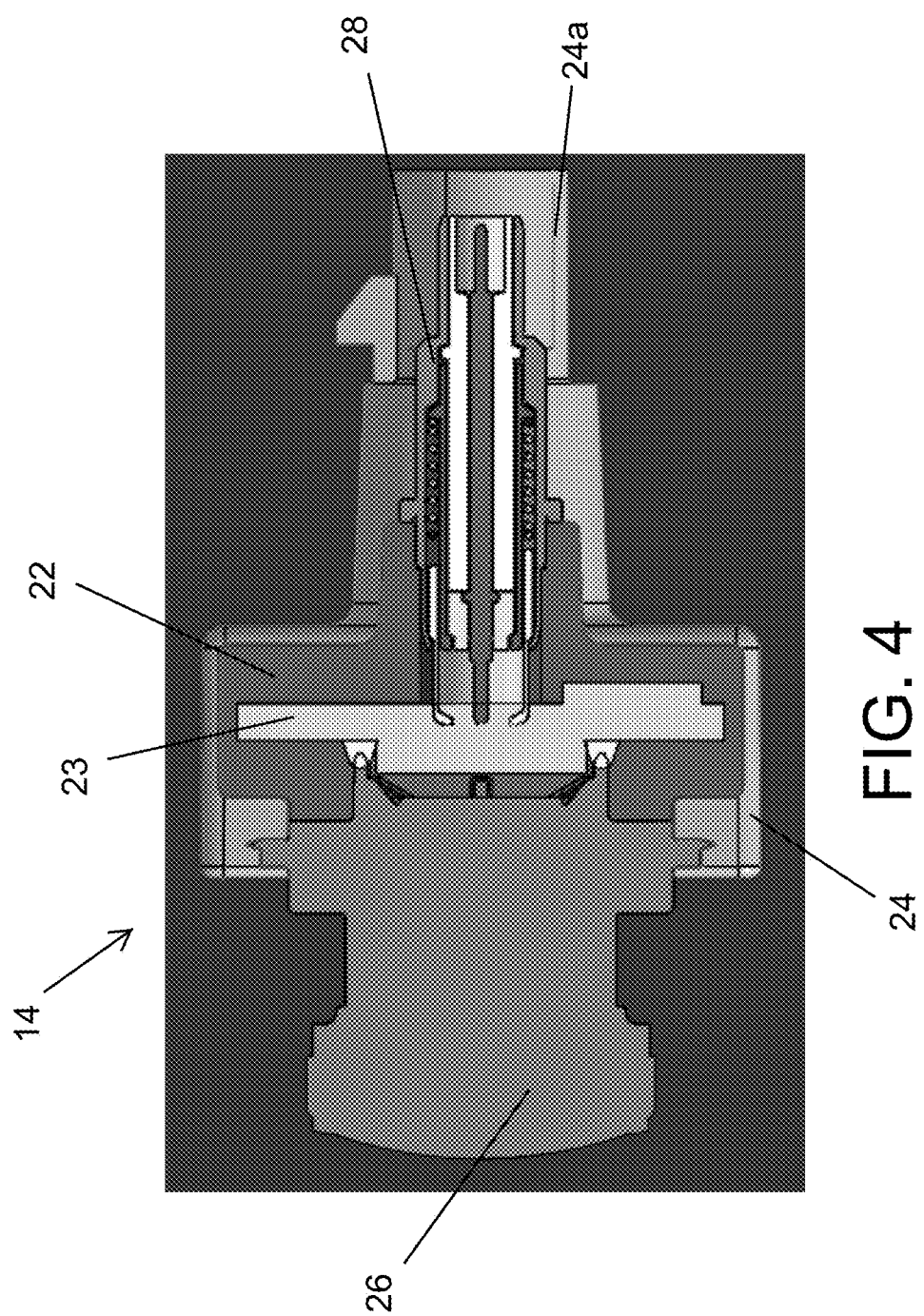

As shown in FIGS. 3-5, a camera module 14 of the present invention comprises a two shot molded housing, which includes an inner low pressure molding or first shot polymer 22 (that is molded over the circuit board 23 and circuitry and a portion of the lens holder) and an outer high pressure injecting molding or shell or second shot polymer 24 that is molded over the inner molding 22 and over a portion of the lens holder 26. The present invention thus utilizes advanced molding techniques coupled with traditional polymers modified as needed for increased thermal performance.

Figure 6:
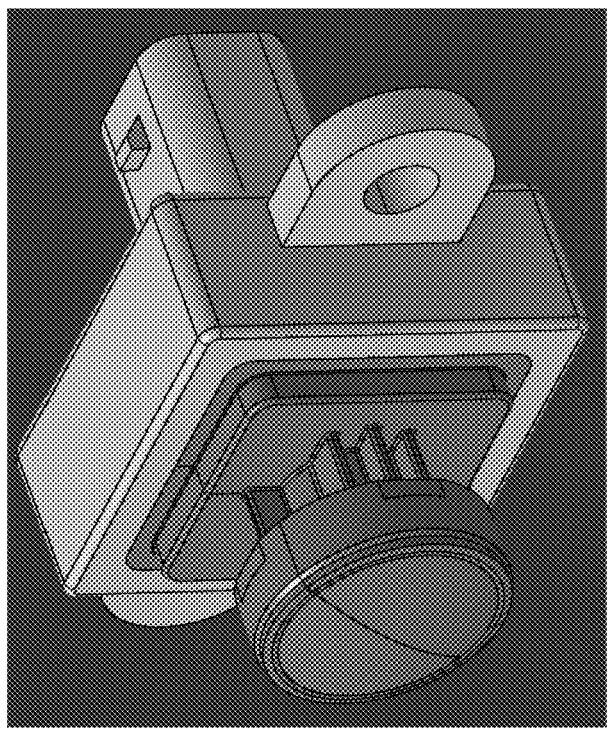
FIG. 6 is a perspective view of another camera module of the present invention, shown with an analog signal connector portion.
Figure 8:
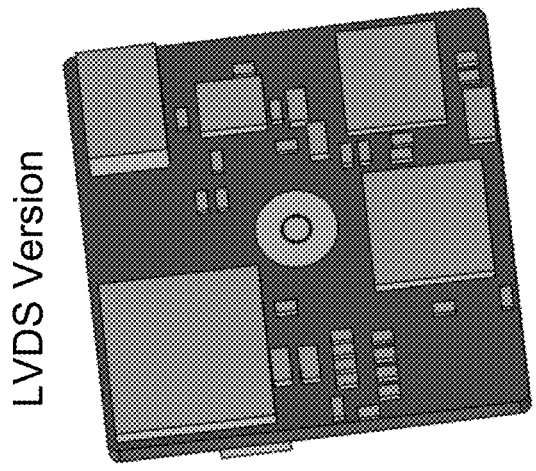
FIG. 8 is a perspective view of a connector side of the printed circuit board, shown with NTSC connector elements suitable for the camera module of FIG. 3.
Figure 7:
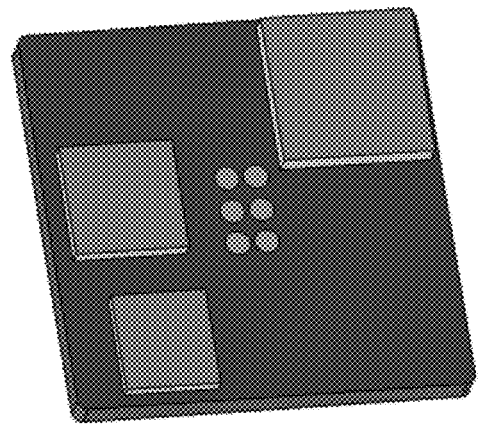
FIG. 7 is a perspective view of a connector side of the printed circuit board, shown with NTSC connector elements suitable for the camera module of FIG. 6.

In the illustrated embodiment of FIGS. 3-5, the camera module outputs a digital signal and has a coaxial spring connector element 28 insert molded at a connector portion 24a of the outer molding 24. Optionally, and such as shown in FIG. 6, the camera module may output an analog signal and may have an analog or multi-pin connector element insert molded at the connector portion of the outer molding, as discussed below. Camera modules made for either application will use the same respective printed circuit board or PCB. For example, and as can be seen in FIGS. 7 and 8, an analog camera application may utilize an NTSC (National Television System Committee) version of the PCB (FIG. 7), which includes multiple connecting elements for electrically connecting to the pins of the multi-pin connector element, while a digital camera application may utilize a low voltage differential signaling (LVDS) version of the PCB (FIG. 8), which includes a coaxial connecting element for electrically connecting to the coaxial connector element.

Figure 10:
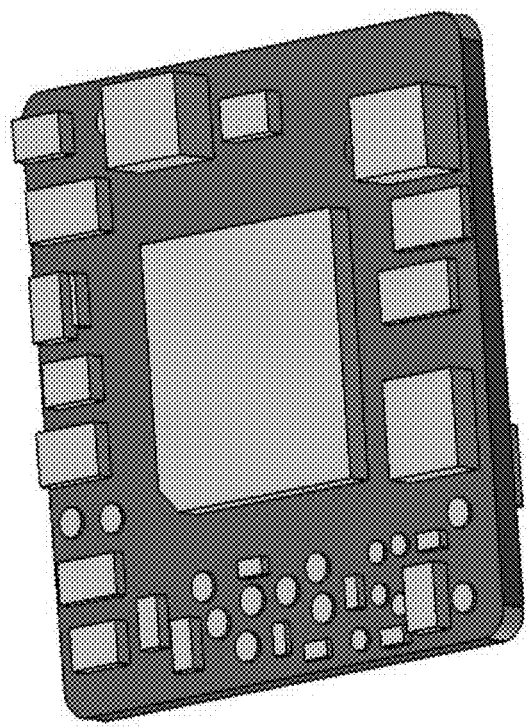
FIG. 10 is a perspective view of an imager side of a printed circuit board suitable for use with the camera module of the present invention.
Figure 9:
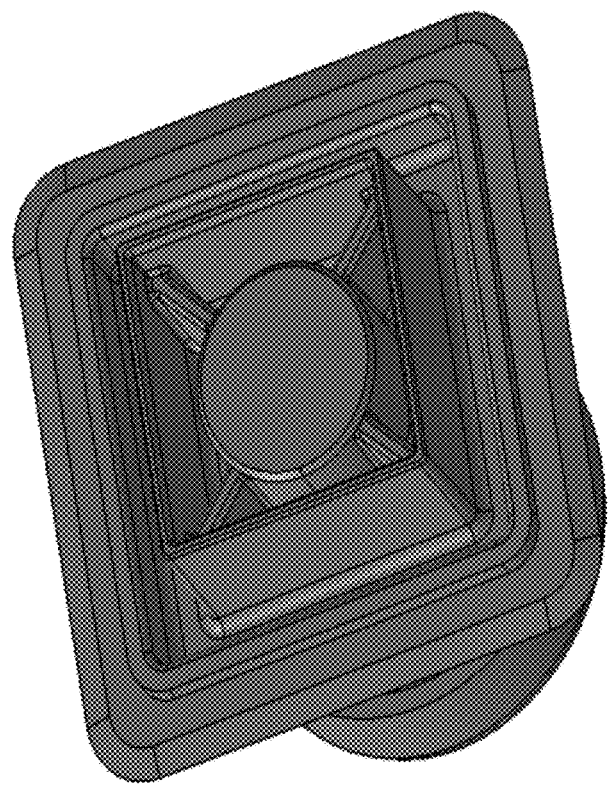
FIG. 9 is a perspective view of a lens holder or lens barrel portion of the camera module of the present invention.
Figure 11:
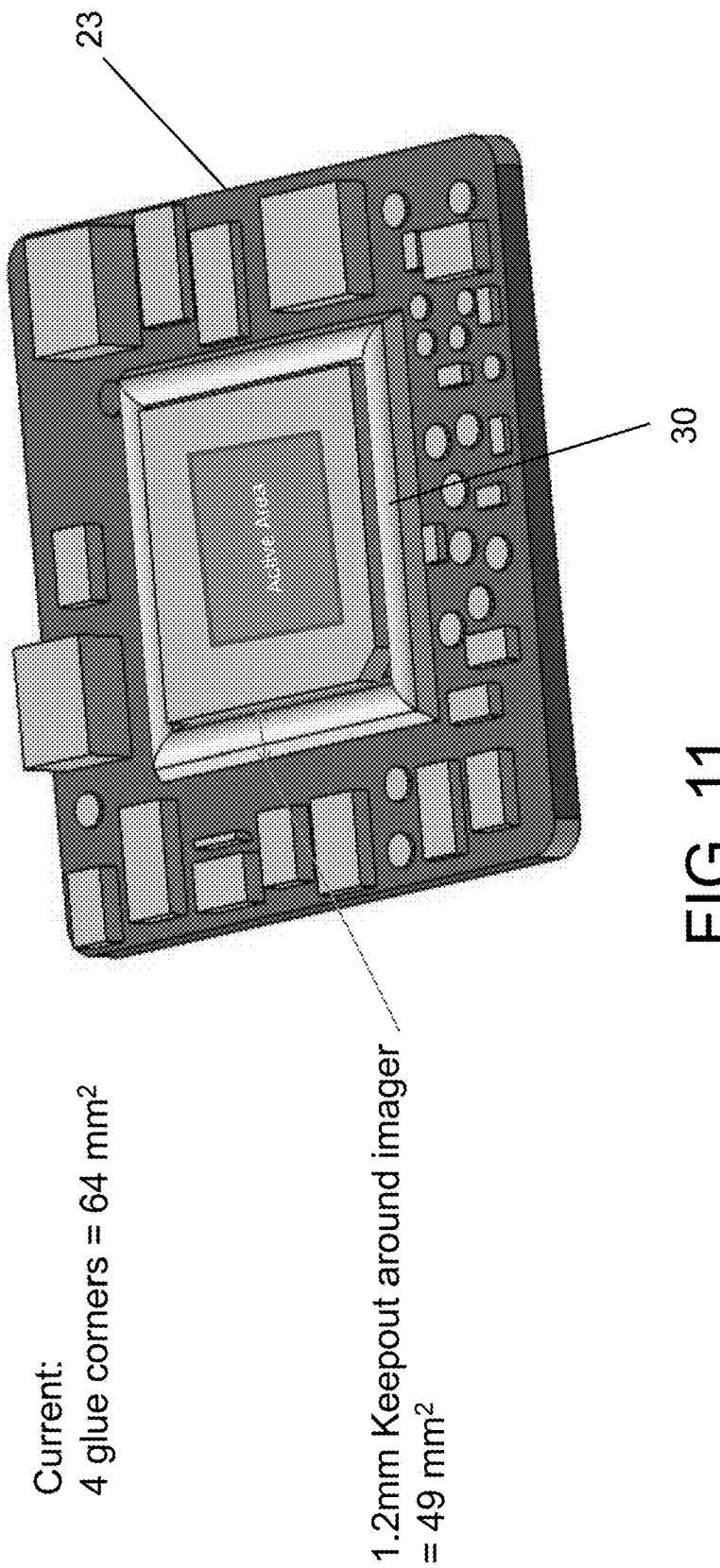
FIG. 11 is another perspective view of the imager side of the printed circuit board of FIG. 10, shown with adhesive disposed around the imager for attaching the printed circuit board at the lens holder.
Figure 14:
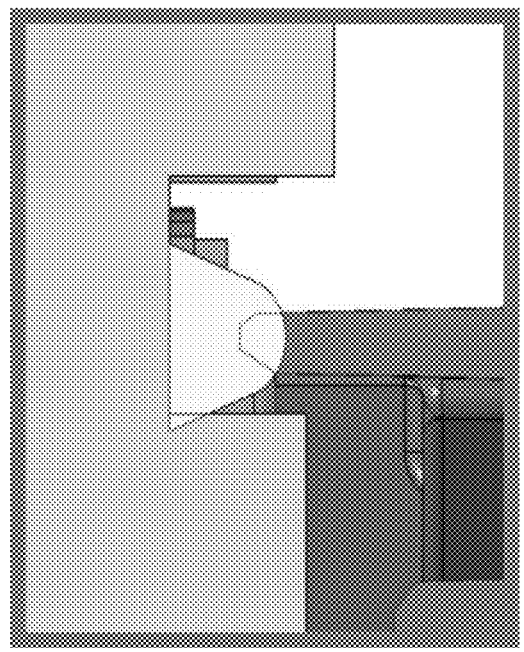
FIG. 14 is an enlarged area of the printed circuit board and lens holder assembly of FIG. 13.
Figure 13:
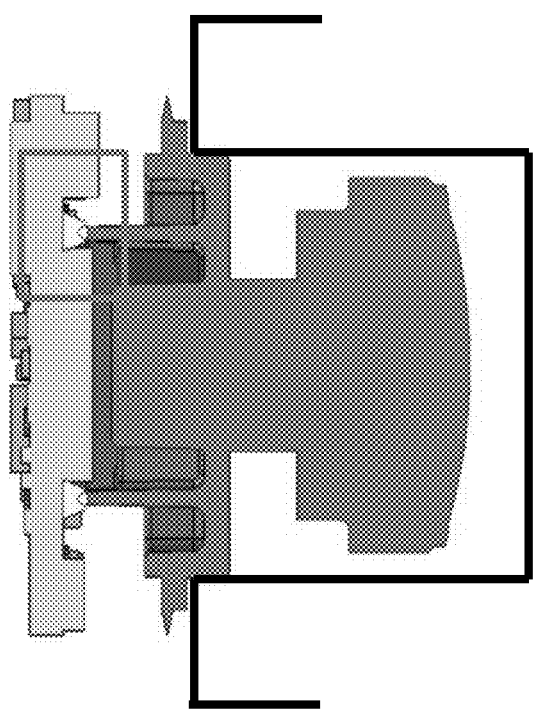
FIG. 13 is a side elevation of the printed circuit board and lens holder assembly of FIG. 12.

During assembly of the camera module, the PCB (FIG. 10) with the imager disposed thereat, is positioned at the lens holder or lens barrel (FIG. 9), and a bead of adhesive 30 (FIG. 11) may be disposed at the PCB 23. The PCB and lens holder may be plasma treated before the adhesive is applied to provide the benefit of a cleaning the imager surface. As shown in FIGS. 12-14, the PCB is then adhered to the lens holder, and the lens is centered and optically aligned at the imager, and the adhesive is at least initially cured to hold the lens relative to the PCB and in optical alignment with the imager. The adhesive and aligning and curing processes may utilize aspects of the systems and methods described in U.S. Pat. Nos. 8,542,451 and 9,277,104, which are hereby incorporated herein by reference in their entireties.

After the lens is optically aligned with the imager and the adhesive is at least initially cured, the lens barrel and PCB construction (see FIGS. 12 and 13) is placed in a low pressure mold and the part is datumed in the tooling by the lens or lens barrel, whereby the first shot polymer 22 is insert molded onto and over and around the PCB, such as with a thermally conductive TECHNOMELT® (low pressure polyamide (PA) adhesive), such as is commercially available from Henkel Electronics Materials LLC of Irvine, Calif. Such a low pressure moldable polyamide may be moldable or applied at between around 200 degrees C. and 240 degrees C. The low pressure moldable polyamide comprises a low-viscosity material that allows for low injection pressures so as to mold over the circuitry without damaging the circuitry or PCB, and the selected material may adhere to the circuit board to form a bond all around the board and circuitry so as to seal the circuit board within the inner molded portion or first shot polymer.

Examples of suitable materials for the first shot mold material include TECHNOMELT® 646 and Raschig thermoset EPDXIDUR® series 3585, 3162, and 3581. The first shot mold material optionally and preferably molds at a pressure of less than about 500 psi, such as at a pressure less than about 300 psi, such as at a pressure between about 100 psi and about 300 psi, or optionally at a pressure of between about 50 psi and about 150 psi. For example, TECHNOMELT PA 646(e) provides a high performance thermoplastic polyamide that is designed to meet low pressure molding process requirements, and can be processed at low processing pressure due to its low viscosity, allowing encapsulation of fragile components without damage. This material produces no toxic fumes during the molding process and provides a good balance of low and high temperature performance.

Figure 21:
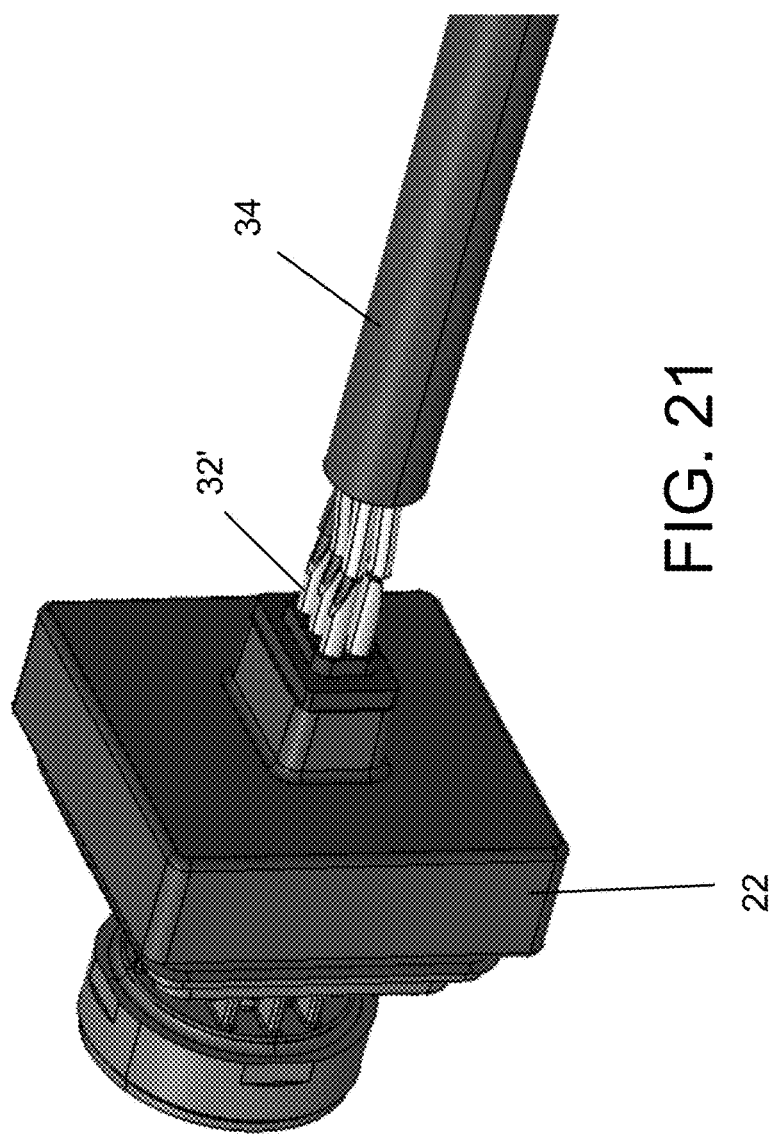
FIG. 21 is a perspective view of the overmolded printed circuit board and lens holder assembly, with the NTSC pigtail connecting elements disposed at the opening in the inner molding so as to electrically connect at the connecting elements at the circuit board.
Figure 20:
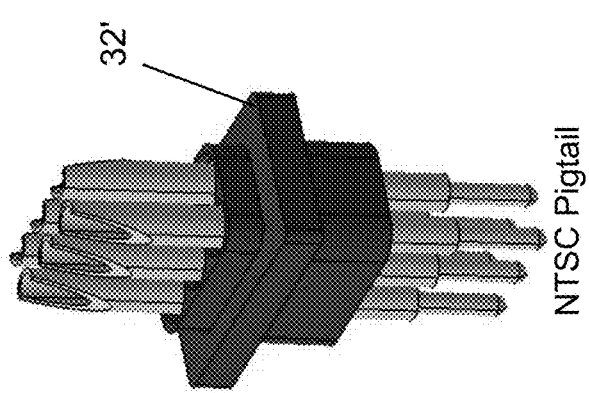
FIG. 20 is a perspective view of an NTSC connector elements configured to electrically connect to the connecting elements at the circuit board so as to provide a pigtail type connection at the connector portion of the camera module.

The molded inner molding 22 has a rear portion or receiving portion 22a that is open to expose the connecting elements at the PCB (shown in FIG. 17 as multiple pads or connecting elements for a multi-pin connector). As shown in FIGS. 18 and 19, an electrical connector element 32 (such as an NTSC direct connect multi-pin element or a spring-loaded coaxial connector or a multi-pin pigtail connector element, depending on the particular application of the camera) is disposed at the opening so as to electrically connect to the connecting elements at the PCB and to have connecting elements or terminals disposed outside of the inner molding. The connector element may be plugged into the opening or receiving portion 22a of the inner molding 22 (and electrically connect to circuitry or a header connector at the PCB) after the inner molding is at least partially cured and before the outer shell is molded over the inner molding and connector element. Optionally, and such as shown in the illustrated embodiment of FIGS. 18 and 19, the multiple pins or terminals may comprise spring-loaded pins to allow for the pins to engage and be biased toward the connecting elements at the PCB when the connector is pressed into the aperture of the inner molding. Optionally and such as shown in FIGS. 20 and 21, a multi-pin pigtail connector element 32' (optionally having spring-loaded pins) may be provided for a pigtail type connector for the camera module.

Figure 23:
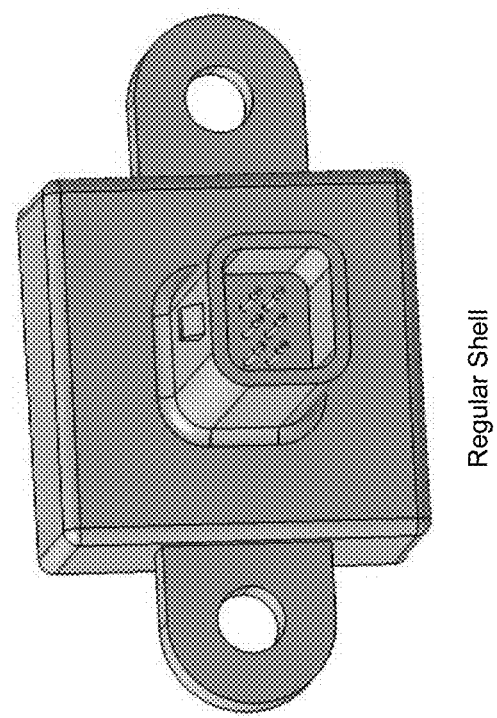
FIG. 23 is a rear perspective view of the camera module of the present invention, shown with a non-EMI shielding shell.
Figure 22:
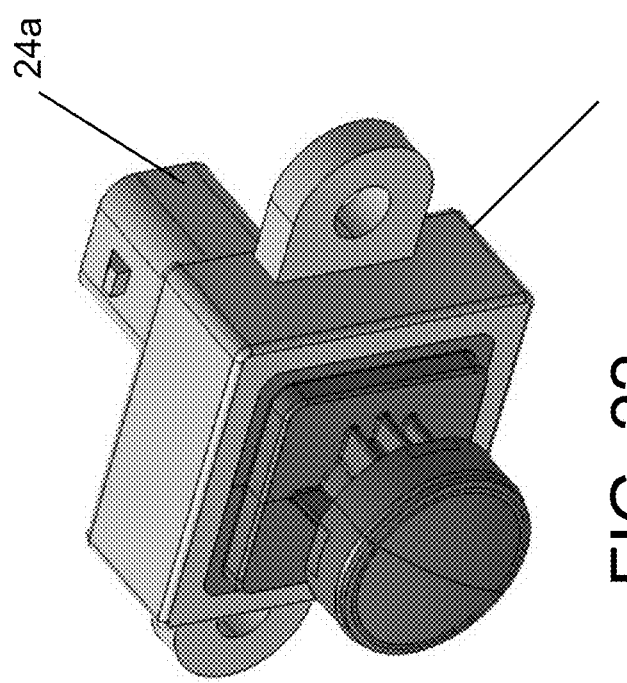
FIG. 22 is a perspective view of the camera module of the present invention, shown with an outer shell molded over the inner molding of the printed circuit board and lens holder assembly in accordance with the present invention.
Figure 25:
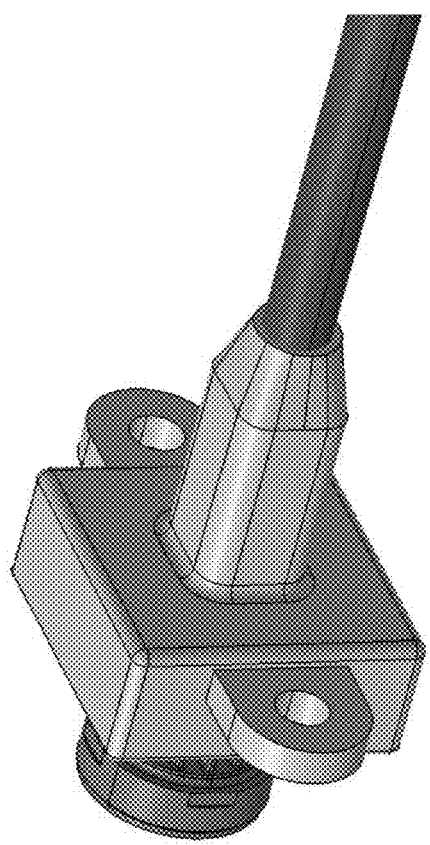
FIG. 25 is a rear perspective view of the camera module of the present invention, shown with a pigtail connector shell.
Figure 24:
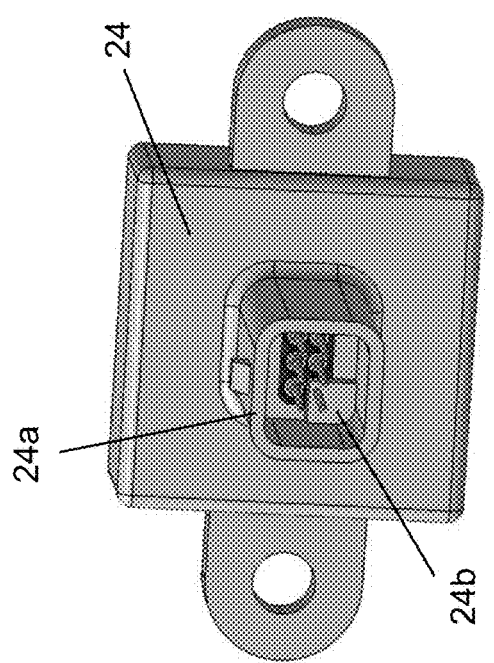
FIG. 24 is a rear perspective view of the camera module of the present invention, shown with an EMI shielding shell.

As shown in FIGS. 22 and 23, the outer shell or second shot polymer 24 is insert molded onto the first shot polymer and lens barrel, such as by using the same datums at the lens barrel as were used for the first shot molding. The molded camera housing thus has little or no packaging tolerances, and is formed with a hard or rigid outer plastic shell. As shown in FIG. 23, the outer shell includes a connector portion molded over and around the connecting element disposed at the aperture of the inner molding, with the connector portion providing the desired shape and connecting feature for electrically connecting the camera module to a wire harness of the vehicle or the like. Optionally, and such as shown in FIG. 24, an EMI shielding shell may be overmolded to provide a grounding terminal or shielding terminal 24b of the connector 24a. Optionally, and as shown in FIG. 25, the same process can form a pigtail connector with just a different rear half of the second shot tool or mold.

The outer shell material may comprise any suitable polymer, such as, for example, a thermally conductive polycarbonate, such as of the type available from Celanese. The outer shell material comprises a moldable polymeric material that, when cured or hardened, provides a durable hard or rigid outer plastic shell for the camera. The material or materials selected for the outer shell material are molded at a higher pressure than the inner or first shot polymer. For example, the outer shell material may be injection molded around the first shot polymer at pressure over around 4,000 psi, or greater than around 6,000 psi, such as, for example, around 8,000 psi.

Figure 26:
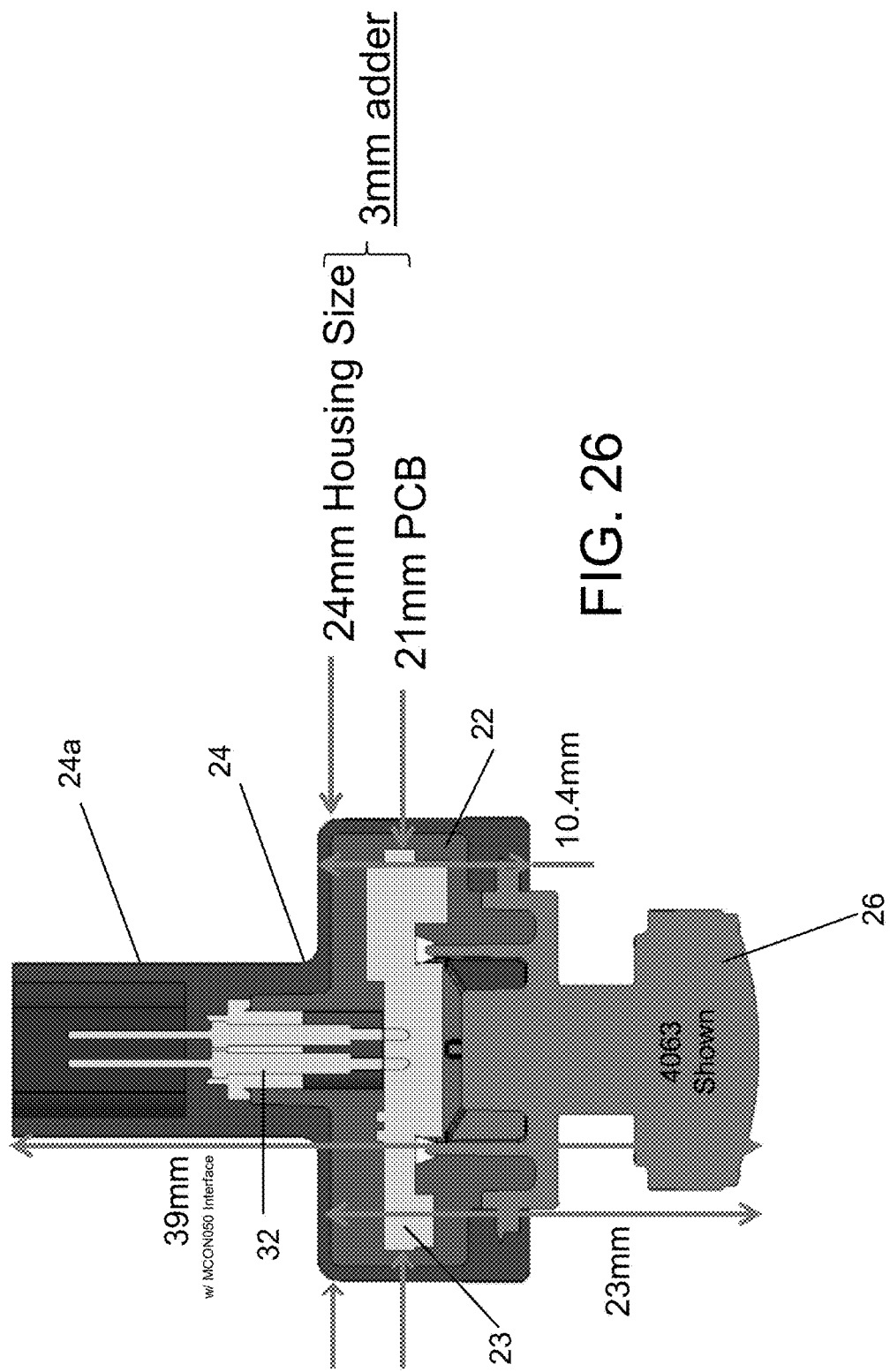
FIG. 26 is a sectional view of the camera module of the present invention.
Figure 27:
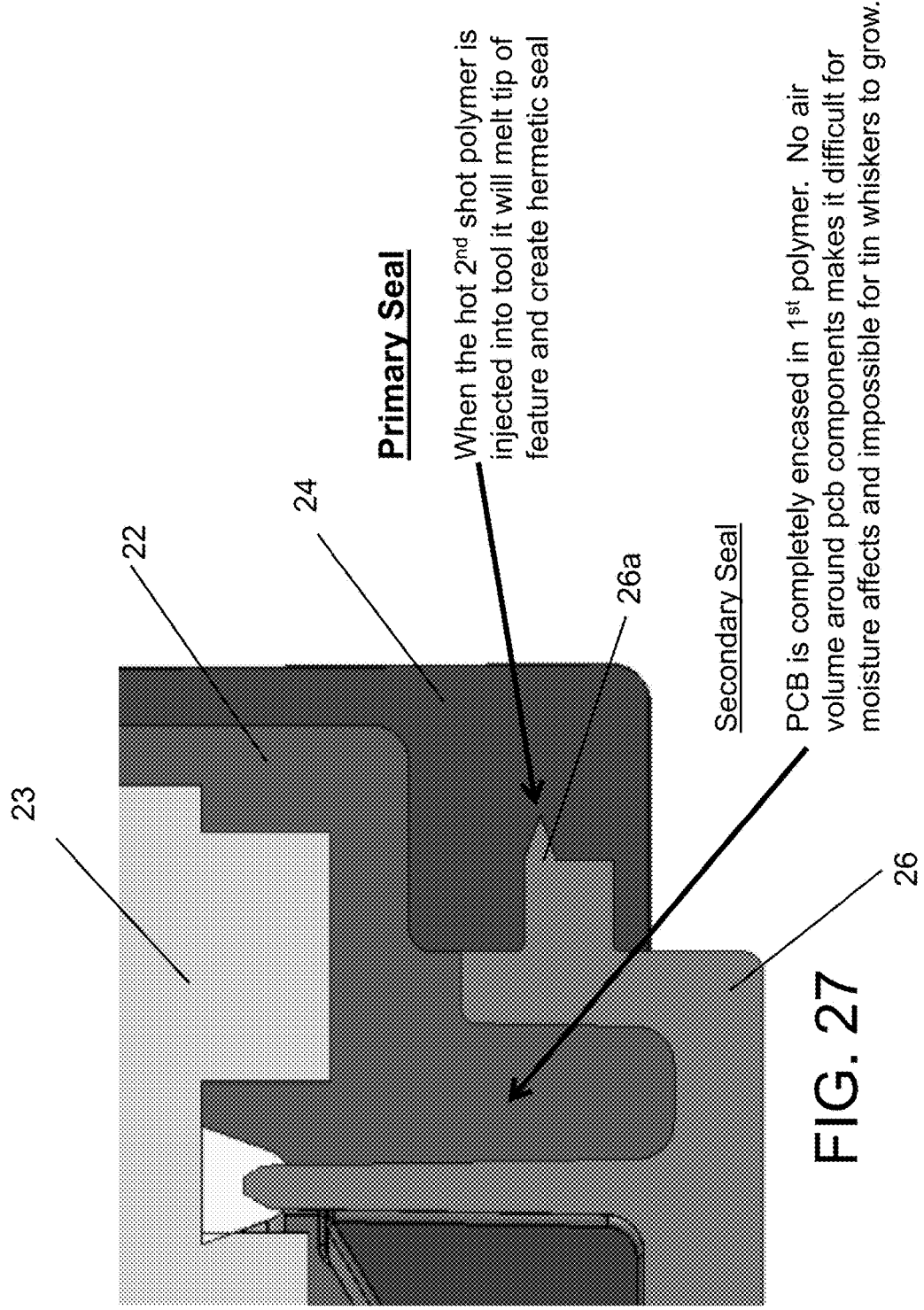
FIG. 27 is an enlarged sectional view of a portion of the camera module of FIG. 26.

Thus, the system and method of the present invention can provide various cameras with different electrical connectors at a molded body that provides reduced tolerances and smaller sizes for the cameras (FIG. 26 shows some exemplary dimensions of a camera module of the present invention). The PCB 23 is completely encased in the first shot polymer 22, and no air volume is around the PCB components and circuitry, which makes it difficult for moisture affects and for tin whiskers to grow. The second shot polymer 24 is injected into the tool and the hot polymer will melt a tip feature 26a (FIG. 27) of the lens barrel 26 to create a hermetic seal between the second shot polymer or shell 24 and the lens barrel 26.

Figure 28:
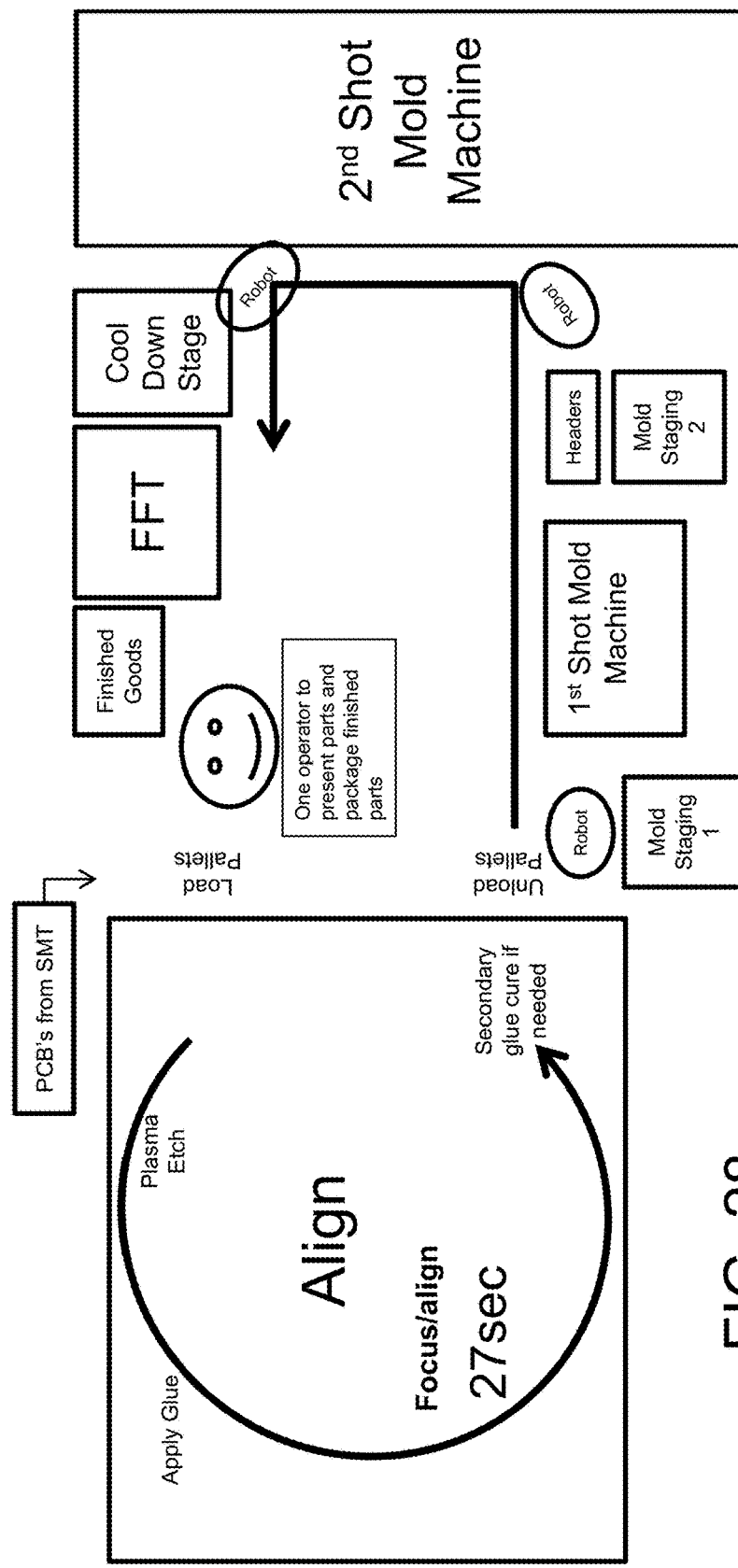
FIG. 28 is a block diagram showing a process flow for manufacturing the camera module of the present invention.
Figure 29:
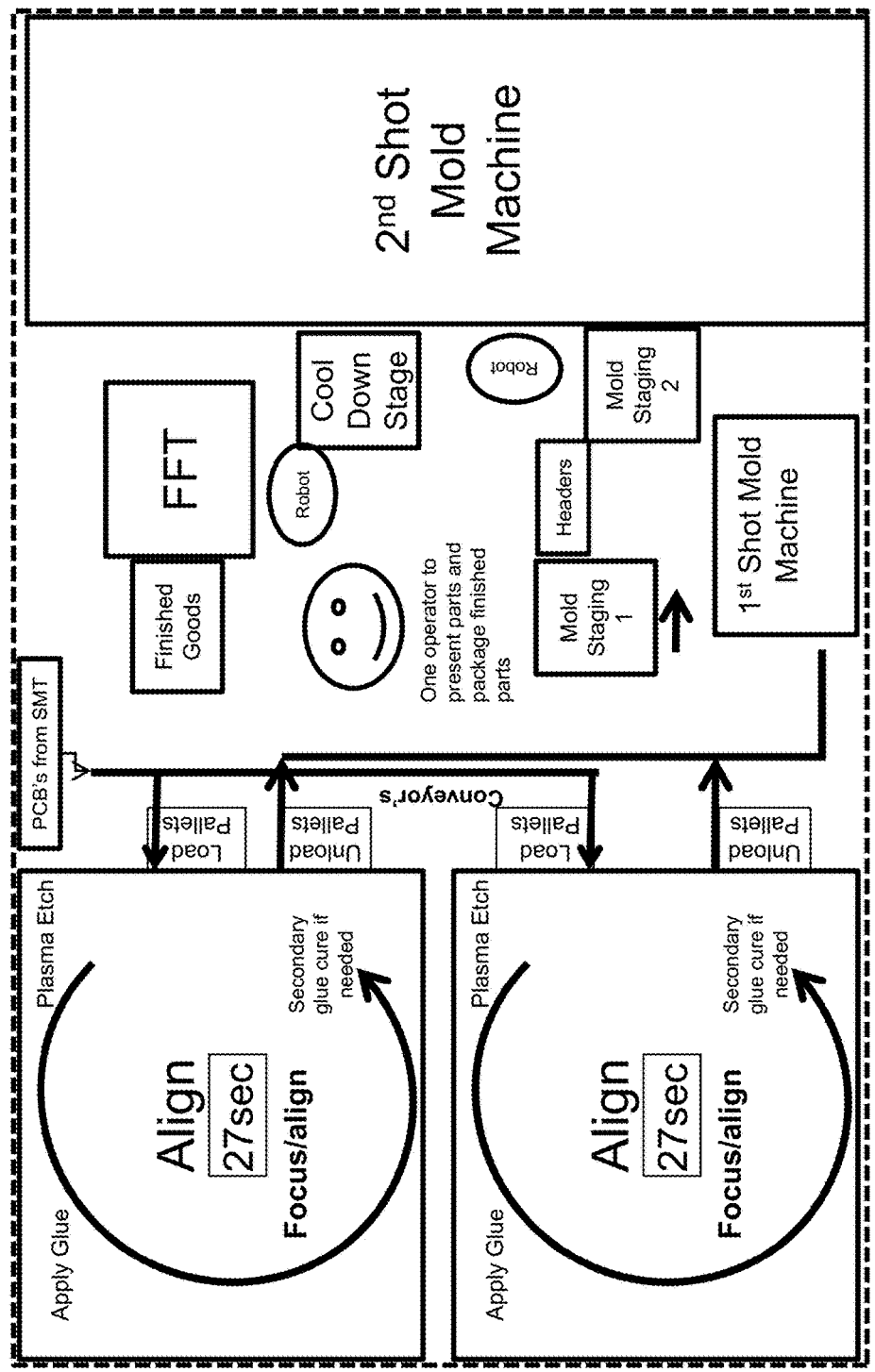
FIG. 29 is another block diagram showing another process flow for manufacturing the camera module of the present invention.

The present invention thus provides enhanced processing and forming of the camera module. Exemplary processes for making cameras of the present invention are shown in FIGS. 28 and 29. As can be seen in FIGS. 28 and 29, the processes include an aligning station, where the lens barrel is attached at the PCB and the adhesive is cured, and include a first shot mold machine that molds the inner molding at the PCB, and include a second shot mold machine that molds the outer molding or shell over the inner molding. The connector element may be inserted into the receiving portion of the inner molding (to electrically connect to the circuitry of the circuit board) within the inner molding after the inner molding is molded and before the outer molding or shell is molded.

Thus, the system or process or camera of the present invention has a first shot material molded over the circuit board and circuitry and portion of the lens barrel that is at or adhered to the circuit board to fully encase the circuit board. For example, the first shot material may comprise a glassfiber reinforced and inorganically filled epoxy molding compound, such as a low pressure molded thermoset material (such as Raschig's EPDXIDUR® EP 3581) that has good mechanical strength (when cured) and very good electrical isolation properties and dimensional stability even at high temperatures. The first shot material may be molded at a first molding pressure of less than around 1,000 psi, preferably less than around 500 psi, such as less than around 300 psi.

During the first shot molding process, the connector pads or circuitry or header at the circuit board (that are to electrically connect to the terminals of the connector element) are not molded over so that they are exposed after the first shot molding is completed. Such exposure can be provided by the mold itself, which may have a mold wall or insert element that is placed at and over the connector pads or header during the first shot molding process and then removed before the second shot molding process. The mold wall also forms the receiving portion at the rear of the inner molding so that the inner molding is configured to receive the electrical connector element therein prior to the second shot molding process.

The second shot molding process molds the second material over the electrical connector element that is disposed at the connector pads or header after the first shot molding process is completed, and over the first shot or inner molding and over an additional part of the lens holder. The second shot material provides a hard protective shell over the inner molding. The second shot material is molded at a second molding pressure that may be greater than around 5,000 psi, such as around 8,000 psi or thereabouts. The second shot material need not have good electrical isolation properties since it is not in contact with any electrical circuitry or the like.

By providing the electrical connector element after the first shot molding is completed, the mold for the first shot may comprise a universal mold that molds over various circuit boards and lens holders, such as a circuit board for connection to a multi-pin connector or to a pigtail connector. After the first shot molding is complete, the appropriate or selected connector element is plugged into the receiving portion of the first shot and electrically connected to the circuitry or header at the circuit board. The second shot molding then may provide the desired overmolding and connector portion for the particular application of that camera (e.g., multi-pin connector or pigtail connector or the like).

Optionally, it is envisioned that the camera may be formed by molding a single material over the circuit board and portion of the lens holder, with that single material providing the outer shell as well as the encapsulation of the circuit board. For example, the Raschig thermoset material may be used by itself to overmold the circuit board and to provide the outer shell of the camera. In such an application, the thermoset material is injection molded over and around the circuit board and portion of the lens holder, and may also be injection molded around a connector element protruding from electrical contacts at the circuit board. The molding is formed to provide the electrical connector for connecting to a connector of a vehicle wire harness. The connector element may be plugged into a header connector at the circuit board or may be soldered at the circuit board before the molding is injection molded over and around the circuit board and portion of the lens holder. The mold is configured to form the electrical connector (such as a plug or socket type connector) at and around the connector element, such as with a wall or portion of the mold engaging the outer end of the connector element to limit or preclude the molten material from intrusion at the connector during the low pressure molding process.

The single shot molding may be injection molded at a low pressure (such as less than 500 psi, such as less than 200 psi or thereabouts), and can rapidly cure (in about 45 seconds or less) to a hardened state, where the molding protects and encapsulates the circuit board and circuitry and that also provides a hard outer shell of the camera. Optionally, a second shot molding may be provided over the molding, where the second shot may comprise injection molding of a higher pressure material (such as discussed above) or may comprise injection molding of the same low pressure material or a different low pressure material to provide the desired outer surface and configuration of the camera module.

The present invention thus eliminates some processes, such as laser welding, screw installation, thermal paste dispensing, leak testing, bracket alignment, special end of arm tooling and cure tooling for side by side PCBs, and assembly of flex cable. The present invention adds some processes, such as low pressure molding, high pressure injection molding, assembly to a carrier for two or more PCBs, assembly of a pin connecting element, and assembly of a foam gasket to the camera (if the camera is for a sealed application). However, the additional processes provide benefits, such as reduced size and cost and processing time (by eliminating the other processes above), such that the present invention provides an improved camera module for vehicles.

For example, the camera module of the present invention provides reduced cost and has a reduced package density ratio—best use of camera space. Also, there is little or no risk of laser weld joint leaking, and there are little to no packaging tolerances—and no additional clearance needed around lens or rear cover. The camera module of the present invention does not require rigid flex for two-PCB cameras but can be used if desired in short C bend. The present invention eliminates the requirement of dispensing of thermal paste. The sub-assembly is protected from dust/debris/outgassing prior to molding. Capital costs for tooling are reduced, such as by up to about 50 percent. Also, the process of the present invention only requires one tool instead of separate tools for the lens holder and rear cover. With the process of the present invention, there is potential for full automated assembly, with significant reduction in labor costs. The process will works with any lens, any PCB, any connector, any exit direction, and both NTSC and LVDS. With careful design and forethought, the first shot tooling could be platform specific based on the PCB. There is no internal volume of air inside, which lowers pressure differentials and reduces moisture concerns and eliminates tin whisker concerns as well as the associated validation testing. The present invention provides for perfect or near perfect dimensional form, which allows for mounting features to be added to the camera housing for vehicle packaging. The molded camera module of the present invention also provides enhanced or optimal heat transfer.

Additionally, there will be lower warranty returns for the cameras, simplified quoting responses, fewer camera assemblies and parts for the suppliers to track. The technology of the two shot molded camera could be implemented for forward facing camera products as well. The cameras have common manufacturing architecture for easier implementation and control globally. All of the lens holders are opaque so there are little to no light bleeding issues. The cameras have the same dimensional performance for all cameras, and there is no need for a special polymer with laser transmission properties for the lens holder.

Figure 32:
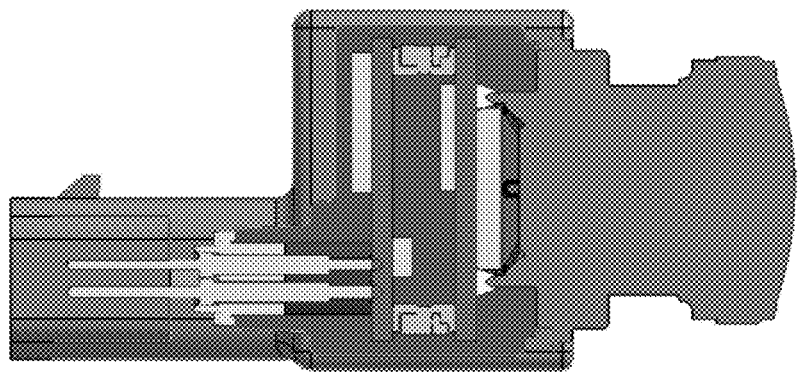
FIG. 32 is a sectional view of the camera module of FIG. 30.
Figure 31:
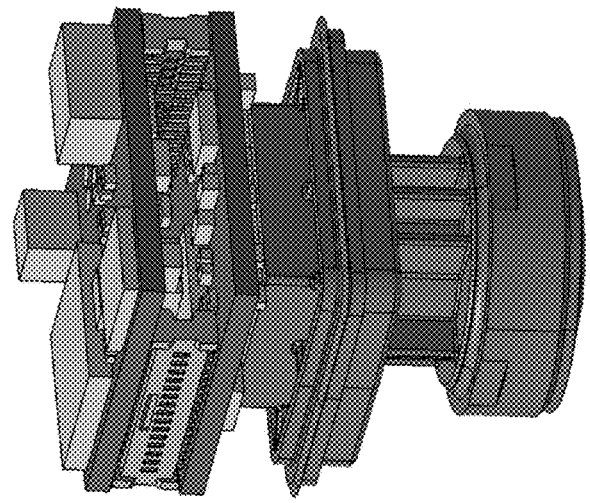
FIG. 31 is a perspective view of the stacked printed circuit boards and lens holder assembly of the camera module of FIG. 30, without the inner molding molded thereat.
Figure 30:
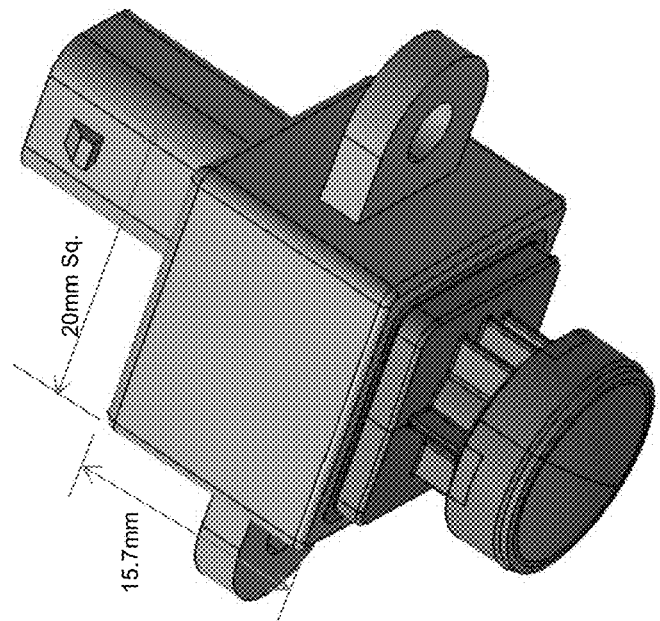
FIG. 30 is a perspective view of another camera module of the present invention, having a dual printed circuit board.

Optionally, the camera module may comprise two PCBs or a multi-board stack, whereby the inner molding is molded over and around and between two PCBs, such as shown in FIGS. 30-32. The processes and materials used to mold an inner lower pressure molding over and around and between the two PCBs and portion of the lens holder and to mold an outer shell over and around the inner molding and connector element and portion of the lens holder may be substantially similar to the processes and materials discussed above, such that a detailed discussion of the processes and materials need not be repeated herein.

Figure 34:
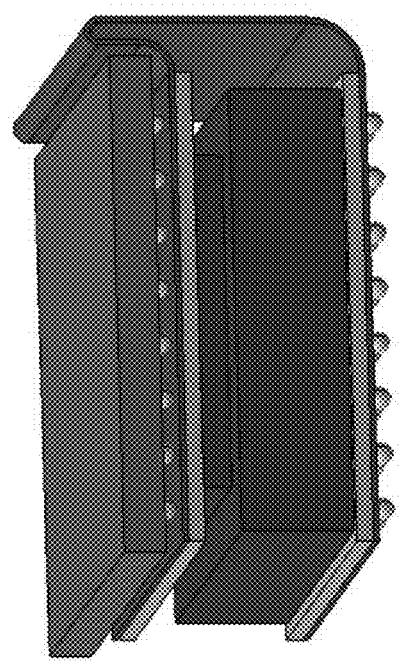
FIG. 34 is a perspective view of the circuit boards and focusing device of the camera module of FIG. 33.
Figure 33:
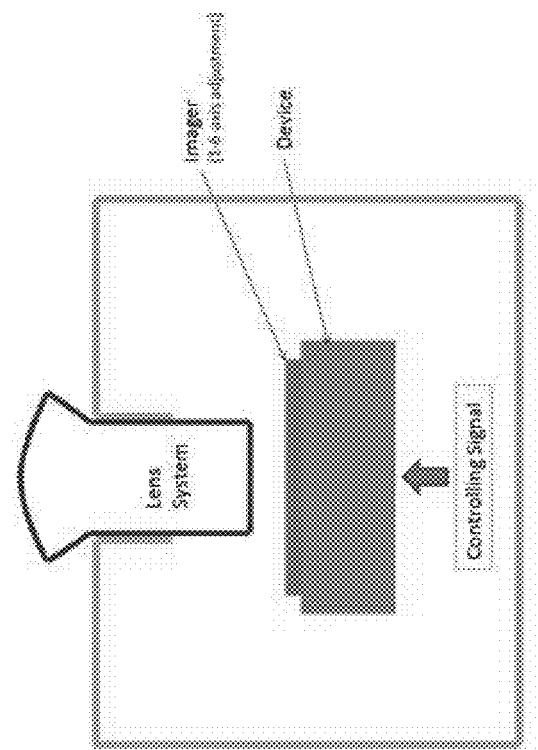
FIG. 33 is a schematic showing a camera module with an adjustable focusing device in accordance with the present invention.
Figure 35:
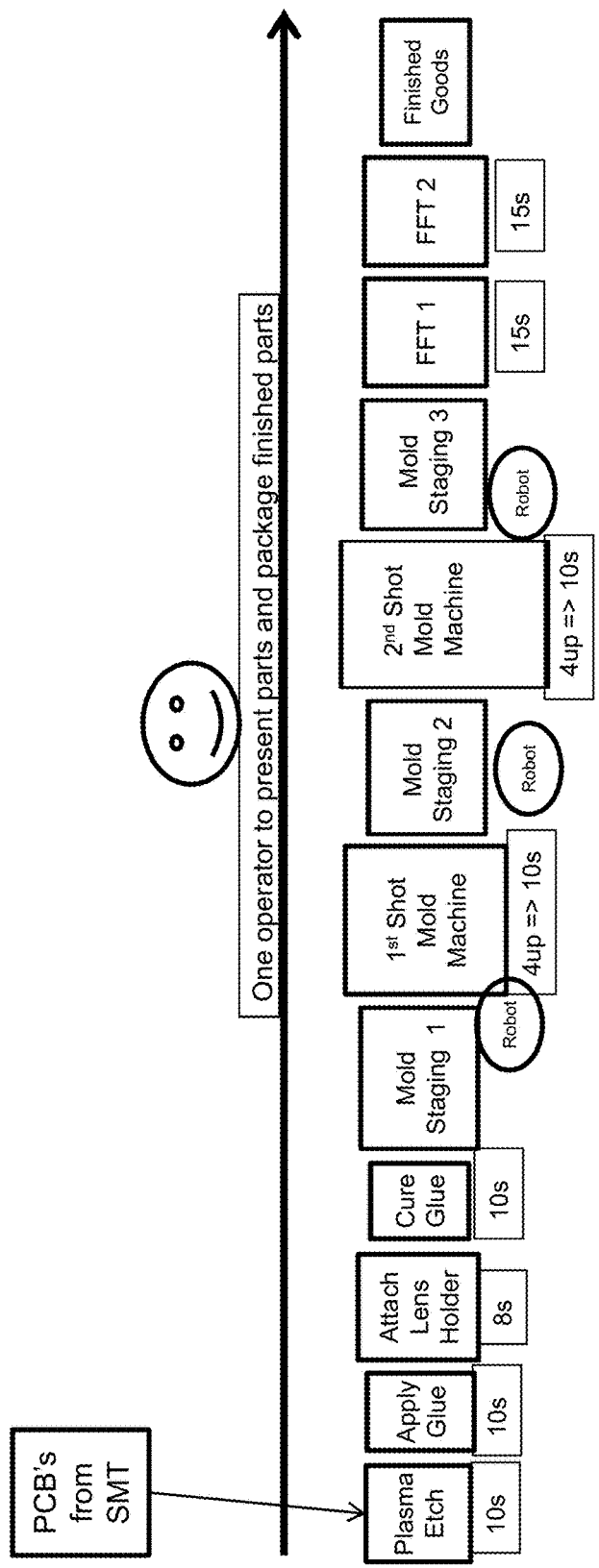
FIG. 35 is a block diagram showing another process flow for manufacturing the camera module of the present invention.

Optionally, the camera module may include an adjustable focus feature, such as by utilizing a micro electro-mechanical system (MEMS). For example, the camera may include a control device in the housing that receives a controlling signal (such as responsive to a user input or an automatic control signal or the like) and adjusts a position of the imager relative to the lens to establish the desired or selected or appropriate focus or focal length of the camera, such as by utilizing aspects of the cameras described in U.S. Publication No. US-2017-0048463, which is hereby incorporated herein by reference in its entirety. Such a system is shown in FIGS. 33 and 34. Also, an exemplary process flow chart for manufacturing a two shot molded camera with MEMS is shown in FIG. 35. The result of such a camera would be a low cost camera with enhanced performance and with reduced mechanical and validation resources and with a mechanical platform fit for evolving through generations of electrical architecture evolution.

Optionally, the camera module may be formed with a smaller circular shaped PCB or PCBs, such as shown in FIGS. 36 and 37. Such a camera construction has smaller, round PCBs (such as having diameters of about 14 mm and 17 mm or thereabouts), and changes to voltage regulator and LVDS filter components. The circuit board is electrically connected to circuitry or conductive traces of the camera housing, with the conductive traces comprising molded interconnect (MID) devices. The MID electrically conductive elements or traces are board-to-board (B2B) connections, and electrical connection is from the side of the camera and in-line with the PCB structure. The image signal processing may be done outside of the camera. The camera may utilize aspects of the cameras described in U.S. Publication No. US-2016-0037028, which is hereby incorporated herein by reference in its entirety.

Thus, the present invention provides enhanced camera module manufacturing by using a two shot molding process, with a first low pressure molding to seal the PCB with the PCB aligned and fixed relative to the lens barrel, and a second higher pressure injection molding to surround or encase the inner molding with a rigid or hard plastic shell, which is formed with a desired electrical connector configuration for connecting to the connector end of a vehicle wire harness at the vehicle at which the camera will be installed.

The camera module may utilize aspects of the cameras and connectors described in U.S. Pat. Nos. 9,077,098; 8,994,878 and/or 7,965,336, and/or U.S. Publication Nos. US-2009-0244361; US-2013-0242099; US-2014-0373345; US-2015-0222795; US-2016-0243987 and/or US-2016-0268716, and/or U.S. patent application Ser. No. 15/467,246, filed Mar. 23, 2017 (Attorney Docket MAG04 P-2977), and/or Ser. No. 15/341,048, filed Nov. 2, 2016 (Attorney Docket MAG04 P-2870), and/or U.S. provisional application Ser. No. 62/403,456, filed Oct. 3, 2016, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EyeQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ladar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486;

US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. Pat. No. 9,126,525, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A camera module for a vision system for a vehicle, said camera module comprising:
a circuit element, said circuit element including an imager and associated circuitry, wherein said circuit element includes electrical connecting elements;
a lens mounting element for holding a lens assembly, said lens assembly including at least one optical element;
wherein said lens mounting element is disposed at said circuit element and said at least one optical element is optically aligned with said imager of said circuit element;
an inner molding formed over and around said circuit element and over a portion of said lens mounting element so that said inner molding and said lens mounting element substantially encase said circuit element;
wherein said inner molding comprises a first molded polymer molded at a first molding pressure;
wherein said inner molding has an aperture established at said electrical connecting elements of said circuit element;
a connector element disposed at said aperture so as to be in electrical contact with said electrical connecting elements of said circuit element;
an outer shell molded over and around said inner molding and over another portion said lens mounting element so as to encase said inner molding;
wherein said outer shell comprises a second molded polymer injection molded at a second molding pressure;
wherein said second molding pressure is greater than said first molding pressure;
wherein said outer shell comprises a connector portion that surrounds said connector element, and wherein said connector element is accessible at said connector portion of said outer shell; and
wherein said connector portion is configured to connect to a connector end of a wire harness to electrically connect the connector end of the wire harness to said connector element to establish electrical connection between the wire harness and said electrically connecting elements of said circuit element.

2. The camera module of claim 1, wherein said camera module is configured to be disposed at an exterior portion of a vehicle so as to have a field of view exterior of the vehicle.

3. The camera module of claim 1, wherein said electrical connecting elements of said circuit element comprise a plurality of electrically conductive pads electrically connected to circuitry of said circuit element, and wherein said connector element comprises a plurality of electrically conductive terminals that electrically connect to said electrically conductive pads when said connector element is disposed at said aperture of said inner molding.

4. The camera module of claim 3, wherein said connector element is press fit into a receiving structure of said inner molding at said aperture.

5. The camera module of claim 3, wherein said plurality of electrically conductive terminals comprise a plurality of spring-biased pins.

6. The camera module of claim 1, wherein said connector element comprises a coaxial connector element configured to electrically connect to a coaxial connector end of a coaxial wire harness of the vehicle.

7. The camera module of claim 1, wherein said first molded polymer comprises a thermally conductive hot melt adhesive.

8. The camera module of claim 1, wherein said second molded polymer is molded over a tip feature of said lens mounting element and wherein, when said second molded polymer is heated and molded over said tip feature, said tip feature melts and bonds with said second molded polymer to create a hermetic seal between said outer shell and said lens mounting element.

9. The camera module of claim 1, wherein said lens mounting element is adhesively attached at said circuit element and wherein the adhesive is at least partially cured before said inner molding is molded over and around said circuit element.

10. The camera module of claim 1, wherein said circuit element comprises a printed circuit board with said imager disposed at one side of said printed circuit board and said electrical connecting elements disposed at the opposite side of said printed circuit board.

11. The camera module of claim 1, wherein said first molding pressure is less than 500 psi and said second molding pressure is greater than 5,000 psi.

12. A camera module for a vision system for a vehicle, said camera module comprising:
a printed circuit board, said printed circuit board including an imager and associated circuitry disposed at one side of said printed circuit board and electrical connecting elements disposed at the opposite side of said printed circuit board;
a lens mounting element for holding a lens assembly, said lens assembly including at least one optical element;
wherein said lens mounting element is disposed at said printed circuit board and said at least one optical element is optically aligned with said imager of said printed circuit board;
a connector element disposed at and in electrical contact with said electrical connecting elements of said printed circuit board;
a molding formed over and around said printed circuit board and over a portion of said lens mounting element so that said molding and said lens mounting element substantially encase said printed circuit board;

wherein said lens mounting element is adhesively attached at said printed circuit board and wherein the adhesive is at least partially cured before said molding is molded over and around said printed circuit board;

wherein said molding comprises a molded polymer that is injection molded at a molding pressure less than 500 psi, and wherein said molded polymer comprises a thermoset adhesive;

wherein said molding comprises a connector portion that surrounds said connector element, and wherein said connector element is accessible at said connector portion of said molding;

wherein said connector portion is configured to connect to a connector end of a wire harness to electrically connect the connector end of the wire harness to said connector element to establish electrical connection between the wire harness and said electrically connecting elements of said printed circuit board; and wherein said camera module is configured to be disposed at an exterior portion of a vehicle so as to have a field of view exterior of the vehicle.

13. The camera module of claim 12, wherein said electrical connecting elements of said printed circuit board comprise a plurality of electrically conductive pads electrically connected to circuitry of said printed circuit board, and wherein said connector element comprises a plurality of electrically conductive terminals that electrically connect to said electrically conductive pads when said connector element is disposed at said and in electrical contact with said electrical connecting elements of said printed circuit board.

14. The camera module of claim 12, wherein said molded polymer is molded over a tip feature of said lens mounting element and wherein, when said molded polymer is heated and molded over said tip feature, said tip feature melts and bonds with said molded polymer to create a hermetic seal between said molding and said lens mounting element.

15. The camera module of claim 12, wherein a second molding is molded over said molding to provide an outer shell of said camera module.

16. A method of forming a camera module for a vision system for a vehicle, said method comprising:

providing a circuit board, the circuit board including an imager and associated circuitry disposed at one side of the circuit board and electrical connecting elements disposed at the opposite side of the circuit board;

providing a lens mounting element for holding a lens assembly, the lens assembly including at least one optical element;

positioning the lens mounting element at the circuit board and optically aligning the at least one optical element with the imager of the circuit board;

molding an inner molding over and around the circuit board and over a portion the lens mounting element so that the inner molding and the lens mounting element substantially encase the circuit board;

wherein molding the inner molding comprises molding a first molded polymer at a first molding pressure that is less than 500 psi;

wherein molding the inner molding comprises establishing an aperture at the electrical connecting elements of the circuit board;

providing a connector element at the aperture so as to be in electrical contact with the electrical connecting elements of the circuit board;

molding an outer shell over and around the inner molding and over another portion of the lens mounting element so as to encase the inner molding;

wherein molding the outer shell comprises molding a second molded polymer injection molded at a second molding pressure that is greater than 5,000 psi;

wherein molding the outer shell comprises molding a connector portion that surrounds the connector element, and wherein the connector element is accessible at the connector portion of the outer shell; and wherein the connector portion is configured to connect to a connector end of a wire harness to electrically connect the connector end of the wire harness to the connector element to establish electrical connection between the wire harness and the electrically connecting elements of the circuit board.

17. The method of claim 16, wherein the electrical connecting elements of the circuit board comprise a plurality of electrically conductive pads electrically connected to circuitry of the circuit board, and wherein the connector element comprises a plurality of electrically conductive terminals that electrically connect to the electrically conductive pads when the connector element is provided at the aperture of the inner molding.

18. The method of claim 16, wherein providing the connector element comprises press fitting the connector element into a receiving structure of the inner molding at the aperture.

19. The method of claim 16, wherein molding the second molded polymer comprises injection molding the second molded polymer over a tip feature of the lens mounting element, and wherein, when the second molded polymer is heated and injection molded, the tip feature melts and bonds with the second molded polymer to create a hermetic seal between the outer shell and the lens mounting element.

20. The method of claim 16, wherein, after positioning the lens mounting element at the circuit board and optically aligning the at least one optical element with the imager of the circuit board, said method comprises adhesively attaching the lens mounting element at the circuit board and at least partially curing the adhesive before molding the inner molding over and around the circuit board.

* * * * *